United States Patent
Hiraoka et al.

(10) Patent No.: US 7,462,578 B2
(45) Date of Patent: Dec. 9, 2008

(54) METHOD AND APPARATUS FOR PRODUCING PHOTOCATALYST

(75) Inventors: Junji Hiraoka, Kitakyushyu (JP);
Minoru Takashio, Kitakyushyu (JP);
Tetsuya Fukushima, Kitakyushyu (JP);
Daisuke Noguchi, Yokohama (JP);
Yoshio Kawamata, Yokohama (JP)

(73) Assignee: Shibaura Mechatronics Corporation, Yokohama-shi (JP)

( * ) Notice: Subject to any disclaimer, the term of this patent is extended or adjusted under 35 U.S.C. 154(b) by 717 days.

(21) Appl. No.: 10/496,010

(22) PCT Filed: Nov. 29, 2002

(86) PCT No.: PCT/JP02/12498

§ 371 (c)(1),
(2), (4) Date: Sep. 28, 2004

(87) PCT Pub. No.: WO03/045554

PCT Pub. Date: Jun. 5, 2003

(65) Prior Publication Data

US 2005/0020444 A1    Jan. 27, 2005

(30) Foreign Application Priority Data

Nov. 29, 2001 (JP) .............................. 2001-364530

(51) Int. Cl.
*C23C 14/08* (2006.01)
*C23C 14/10* (2006.01)
*C23C 14/14* (2006.01)
*C23C 14/34* (2006.01)
*C23C 14/58* (2006.01)
*B01J 37/025* (2006.01)
*B01J 37/08* (2006.01)
*B01J 37/14* (2006.01)
*B05D 1/38* (2006.01)
*B05D 3/02* (2006.01)
*B05D 5/12* (2006.01)

(52) U.S. Cl. ................. 502/350; 502/242; 423/610; 427/74; 427/78; 427/314; 427/331; 427/372.2; 427/419.2; 427/454

(58) Field of Classification Search .............. 423/447.2, 423/447, 610; 502/242, 350; 427/74, 78, 427/314, 331, 372.2, 419.2, 454
See application file for complete search history.

(56) References Cited

FOREIGN PATENT DOCUMENTS

| EP | 539 260 | 4/1993 |
|---|---|---|
| EP | 967 008 | 12/1999 |
| EP | 1 068 899 | 1/2001 |
| JP | 2001-55799 | 2/2001 |

OTHER PUBLICATIONS

No English Abstract.
Hideyuki Hiraiwa, et al., "Spattering-ho ni yoru Hikari Shokubaisei Sanka Titan-maku no Kaihatsu" Reports of the Toyama Industrial Technology Center, No. 14, p. 7, Jul. 12, 2000.*

* cited by examiner

*Primary Examiner*—Timothy C. Vanoy
*Assistant Examiner*—Serena L Hanor
(74) *Attorney, Agent, or Firm*—Oblon, Spivak, McClelland, Maier & Neustadt, P.C.

(57) ABSTRACT

A method of producing a photocatalyst according to the invention comprises forming an amorphous titanium oxide and heat-treating it in an atmosphere containing oxygen, whereby a photocatalyst having a good photocatalysis can be obtained. In particular, the amorphous titanium oxide is obtained by using the reactive sputtering method and via deposition at a low temperature and at a high film formation rate. This apparatus can be provided with cooling means to allow enhancement of the throughput of the film formation process.

12 Claims, 24 Drawing Sheets

METHOD AND APPARATUS FOR PRODUCING PHOTOCATALYST

TECHNICAL FIELD

The invention relates to a method and apparatus for producing a photocatalyst. In particular, the invention relates to a method of producing a photocatalyst having photocatalysis of promoting generation of active species by light irradiation, and to an apparatus for producing a photocatalyst suitable for use in such production.

BACKGROUND ART

Recently, a photocatalytic thin body using titanium dioxide has drawn attention. "Photocatalyst" is a substance having semiconductive physical properties, excited when light with energy higher than the band gap energy between the conduction and valence electron bands is irradiated, and thereby producing electron-hole pairs.

Titanium dioxide with an anatase type crystal structure is photo-excited by irradiation of light with wavelengths of 387 nm or shorter. This causes decomposition reaction based on redox reaction, and simultaneously, hydrophilization reaction different from the decomposition reaction (activity). So far, titanium oxide, tin oxide and zinc oxide have been known as a metal oxide simultaneously causing these two reactions. Strontium titanate and ferric oxide have been known as a metal oxide causing only the decomposition reaction, and tungsten trioxide has been known as a metal oxide causing only the hydrophilization reaction.

The above-mentioned reactions can be utilized to provide self-washing, deodorization, anti-bacterial and other functions, and a variety of members and groups of products coated with such a photocatalyst have been proposed.

Various methods for producing such a photocatalyst have been proposed including a binder method, a sol-gel method, and a vacuum evaporation method.

The binder method involves dispersing fine grains of titanium oxide in an adhesive binder, applying the resulting dispersion to a predetermined substrate, and heating and drying the dispersion. However, the method has a problem that since the fine grains of titanium oxide are buried in the binder, the photocatalysis tends to be deteriorated.

The sol-gel method is a method of obtaining a photocatalytic film by applying a liquid-phase agent including titanium chelate or titanium alkoxide containing titanium to a predetermined substrate, drying and then firing the agent at a high temperature of 500° C. or higher. However, the method has a problem that it requires the firing step at a high temperature of 500° C. or higher, which imposes considerable limitations on available substrates in terms of heat resistance.

Another problem in the so-called "wet methods" including the binder and sol-gel methods is the poor durability of the photocatalytic film. Furthermore, these wet methods require a film thickness of 400 to 600 nm for enhancing film crystallinity and obtaining a good photocatalysis. This film thickness also causes a problem that it is likely to create "color mottling" due to the interference effect in the visible light band.

In contrast to these formation methods, formation methods using the so-called "dry methods" such as a vacuum evaporation method and sputtering method have been proposed.

For example, Japanese Patent No. 2,901,550 discloses a photocatalyst having a layered structure of titanium oxide and silicon oxide formed by a vacuum evaporation method.

Also, Japanese Patent Application Laid-Open No. 2000-126613 discloses a method of depositing silicon oxide by a reactive sputtering method.

However, even in these dry methods, the relationship between the film formation condition and the performance of the resulting photocatalytic films is poorly understood and leaves room for improvement. Furthermore, these methods are to be improved in terms of productivity and cost, because the film formation rate in these methods is generally low.

The invention is accomplished based on such findings. An object of the invention is to provide a method of producing a photocatalyst having an excellent photocatalytic property, improved productivity, and a good dark place retention property, and an apparatus for producing a photocatalyst suitable for use in carrying out such a production method.

DISCLOSURE OF THE INVENTION

A method of producing a photocatalyst in accordance with the invention comprises a first step of forming an amorphous titanium oxide on a substrate, and a second step of crystallizing at least a portion of the titanium oxide by heating the titanium oxide in an atmosphere containing oxygen.

The amorphous titanium oxide formed by the first step may not substantially have crystalline peaks in an X-ray diffraction pattern, and the titanium oxide crystallized by the second step may have crystalline peaks in an X-ray diffraction pattern.

The method may further comprise, after the second step, a third step of forming a coating layer of oxide on the titanium oxide.

The titanium oxide formed in the first step may have a composition formula $TiO_x$ with its oxygen composition x being substantially equal to 2.

The formation of the titanium oxide in the first step may be carried out by a sputtering method.

The sputtering method may be a reactive sputtering method using a target containing titanium and oxygen gas.

The formation of the titanium oxide may be carried out in a condition specified in a graphical diagram in which the total pressure of the atmosphere during deposition in the reactive sputtering method and the addition ratio of oxygen contained in the atmosphere are plotted along x-axis in pascal (Pa) and along y-axis in percent (%), respectively, wherein the condition is defined by a line obtained by connecting points with xy-coordinates of (1.0, 30), (3.5, 10), (5.0, 13), (5.0, 30), (3.5, 30), (1.0, 50), and (1.0, 30) in this order, or by a region surrounded with this line.

The partial pressure of the oxygen gas during deposition in the reactive sputtering method may be greater than 0.1 pascal and less than 1.7 pascal.

The heating temperature in the second step may be 300° C. or higher.

The coating layer may comprise silicon oxide.

The formation of the coating layer in the third step may be carried out by a reactive sputtering method using a target containing an element or elements contained in the coating layer and oxygen gas.

An apparatus for producing a photocatalyst in accordance with the invention is capable of depositing an amorphous titanium oxide on a substrate in an atmosphere having subatmospheric pressure, comprising cooling means for cooling the substrate.

The apparatus may further comprise heating means for heating the substrate, wherein the substrate is heated by the heating means before being cooled by the cooling means, and then the amorphous titanium oxide can be deposited.

The apparatus may further comprise deposition means operable for depositing a coating layer of oxide on the substrate in an atmosphere having subatmospheric pressure, and a heat treatment chamber operable for heating the substrate in an atmosphere containing oxygen, wherein, after the amorphous titanium oxide is deposited on the substrate, the substrate is heated in the heat treatment chamber, and then the coating layer can be deposited by the deposition means.

BEST MODE FOR CARRYING OUT THE INVENTION

Based on results of independent examinations and investigations, the inventors have found that an extremely active photocatalytic film can be obtained by forming a photocatalytic material such as titanium oxide in an amorphous state by sputtering or other methods, and then heat-treating it in a certain condition.

According to this method, photocatalytic films can be provided at an extremely high productivity and low cost. Furthermore, the photocatalytic film exhibits a high photocatalysis even if its film thickness is as small as tens of nanometers. This can eliminate problems including the so-called "color mottling".

Embodiments of the invention will now be described in more detail with reference to specific examples.

Figure 1:
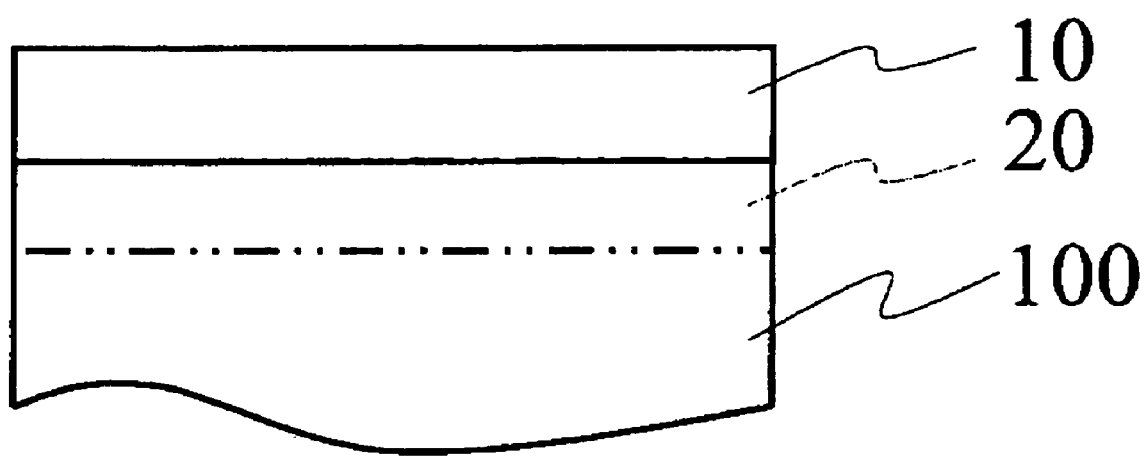
FIG. 1 is a schematic view illustrating a cross-sectional structure of a photocatalyst produced in accordance with the invention.

FIG. 1 is a schematic view illustrating a cross-sectional structure of a photocatalyst produced in accordance with a first embodiment of the invention.

The photocatalyst comprises a photocatalytic film 10 formed in a thin film on a substrate 100. The substrate 100 may be made of various materials such as inorganic materials including glass and ceramics, metallic materials including stainless steel, or organic materials including polymer materials, and may have various shapes and sizes.

The photocatalytic film 10 may be made of a semiconductor material primarily composed of metal oxides. The semiconductor may include, for example, titaniumoxide ($TiO_x$), zinc oxide ($ZnO_x$), tin oxide ($SnO_x$) or other metal oxides. Among others, titanium oxide is active as a photocatalyst, and superior in stability, safety and other respects. Accordingly, an example will hereinafter be described where titanium oxide is used as a metal oxide.

A buffer layer 20 may be formed between the photocatalytic film 10 and the substrate 100 as needed. The buffer layer 20 serves to improve the surface condition of the substrate 100, thereby improving the photocatalytic film 10 in adhesive intensity, film quality, durability and the like. The buffer layer 20 may be made of, for example, silicon oxide ($SiO_2$).

The buffer layer 20 can be formed to prevent impurity contamination from the substrate 100 to the photocatalytic film 10. Further, the buffer layer 20 can reform the surface condition of the substrate 100, thus controlling the initial stage of deposition and crystallization through heat treatment (described later) of the photocatalytic film 10 in an ideal condition.

For example, in the case where soda-lime glass is used for the substrate 100, if alkali elements such as sodium (Na) contained in the glass are diffused in the photocatalytic film 10, the photocatalytic property may be deteriorated. In such a case, the buffer layer 20 of silicon oxide or the like can be formed to avoid the impurity diffusion and to prevent the deterioration of the photocatalytic property.

Also, in the case where the surface of the substrate 100 has microscopic irregularities, the buffer layer 20 can be formed in a proper thickness to moderate the surface irregularities and to direct the initial stage of deposition of the photocatalytic film 10 to a more ideal condition.

Moreover, a coating layer 30 may be stacked on the photocatalytic film 10 as needed. The coating layer 30 may serve to protect the surface of the photocatalytic film 10, and to maintain the hydrophilicity even in a dark place. More specifically, the photocatalytic film 10 develops hydrophilicity and decomposability under light irradiation, while these effects stop without light irradiation. In contrast, if the material and film thickness of the coating layer 30 are set in an appropriate range, the hydrophilicity obtained by the photocatalytic film 10 can be maintained even in such a dark place. The coating layer 30 may include, for example, a silicon oxide ($SiO_2$) film having a thickness in the range of several to ten nanometers.

Figure 2:
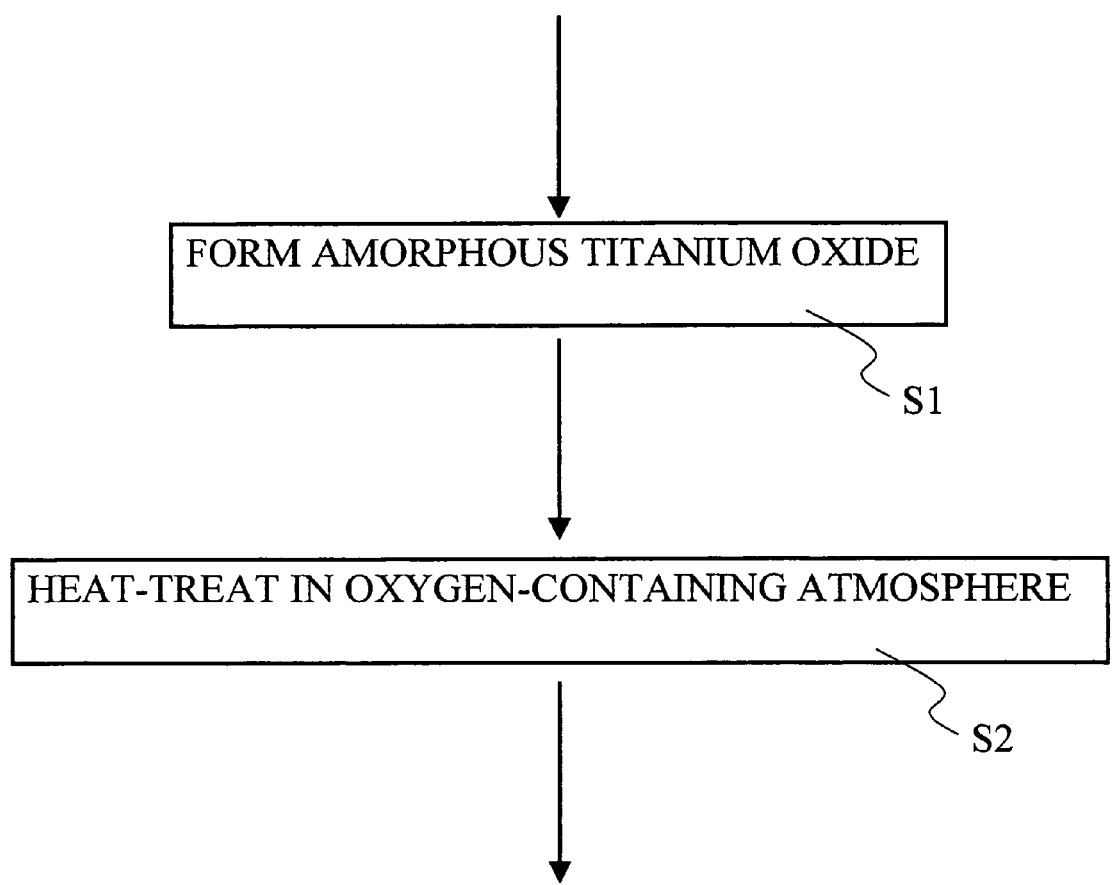
FIG. 2 is a flow chart showing a method of producing a photocatalytic film in accordance with the invention.

FIG. 2 is a flow chart showing a method of producing a photocatalytic film in accordance with the invention.

In accordance with the invention, first, a metal oxide layer to be served as a photocatalytic film 10 is formed on a substrate 100 with a buffer layer 20 being interposed in between, or directly on the substrate 100 without any interposition. Here, in accordance with the invention, the metal oxide is formed in an amorphous state.

Figure 3:
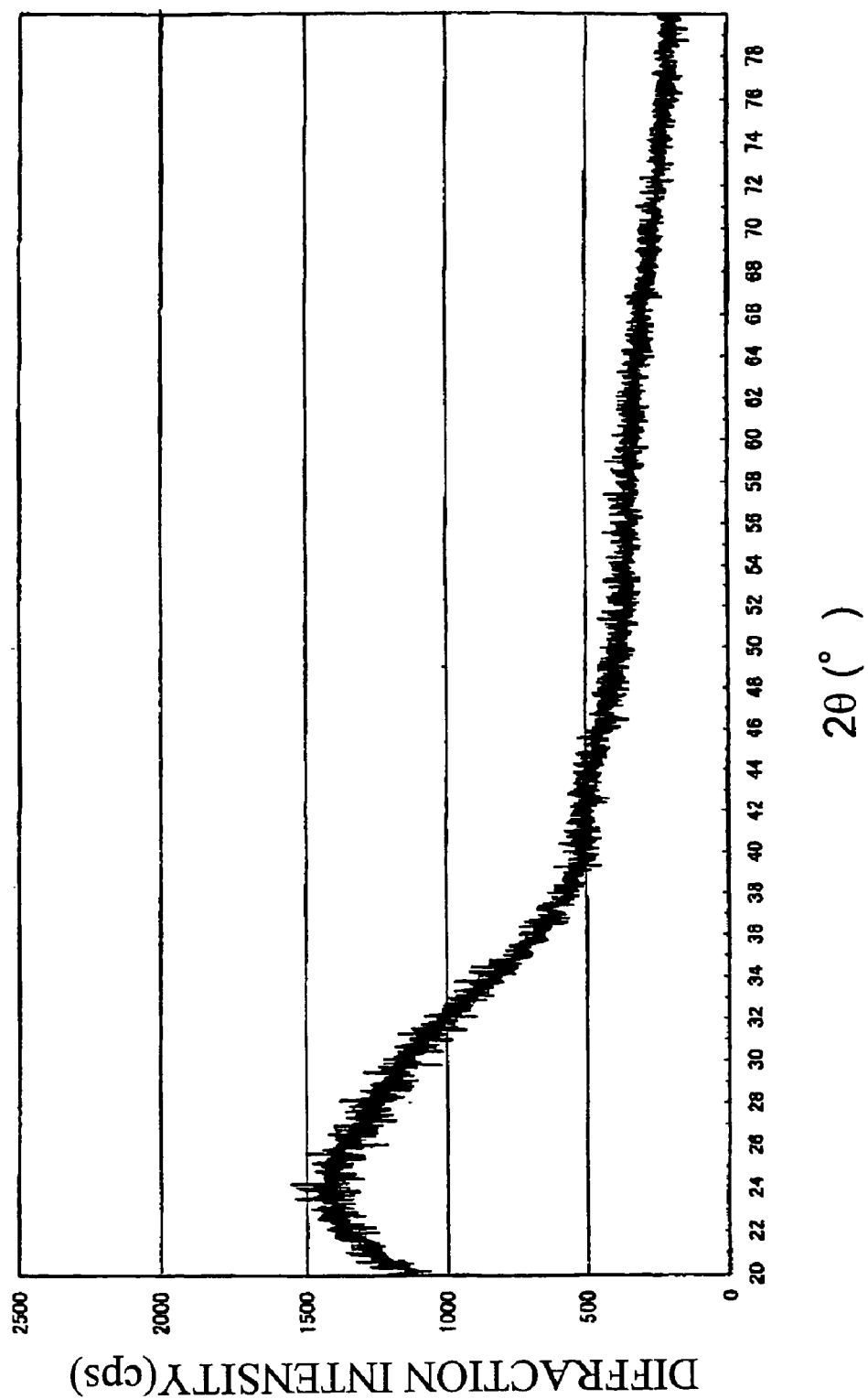
FIG. 3 is a graphical diagram showing a typical example of an X-ray diffraction pattern obtained from an amorphous metal oxide produced in the invention.

FIG. 3 is a graphical diagram showing a typical example of an X-ray diffraction pattern obtained from an amorphous metal oxide produced in the invention. More specifically, the figure shows a result of evaluating an amorphous titanium oxide film having a thickness of about 50 nm obtained by the reactive sputtering method. The film formation condition is such that the total pressure is 1 Pa, the DC input electric power is 2 kW, and the oxygen addition ratio is 30%. The illustrated example is a result of five cumulative measurements of the X-ray diffraction pattern using the grazing incidence method, because the film thickness is small.

As seen in FIG. 3, only a broad halo pattern is observed, with the diffraction angle 2θ being centered approximately at 24 degrees. No sharp peak due to crystal is found. That is, this titanium oxide film is proved to be substantially amorphous.

It is to be noted that "amorphous" used herein refers to a state that is not substantially crystalline. This corresponds to a state, for example, in which any significant peak due to crystal is not obtained in evaluating the X-ray diffraction as illustrated in FIG. 3. It is thus understood that a structure of metal and oxygen atoms arranged in a completely disordered manner is referred to as "amorphous". Additionally, a state in which short-range-order structures, microcrystals and fine crystal nuclei are contained is also referred to as "amorphous".

One method of forming such an amorphous metal oxide is the "reactive sputtering method".

Figure 4:
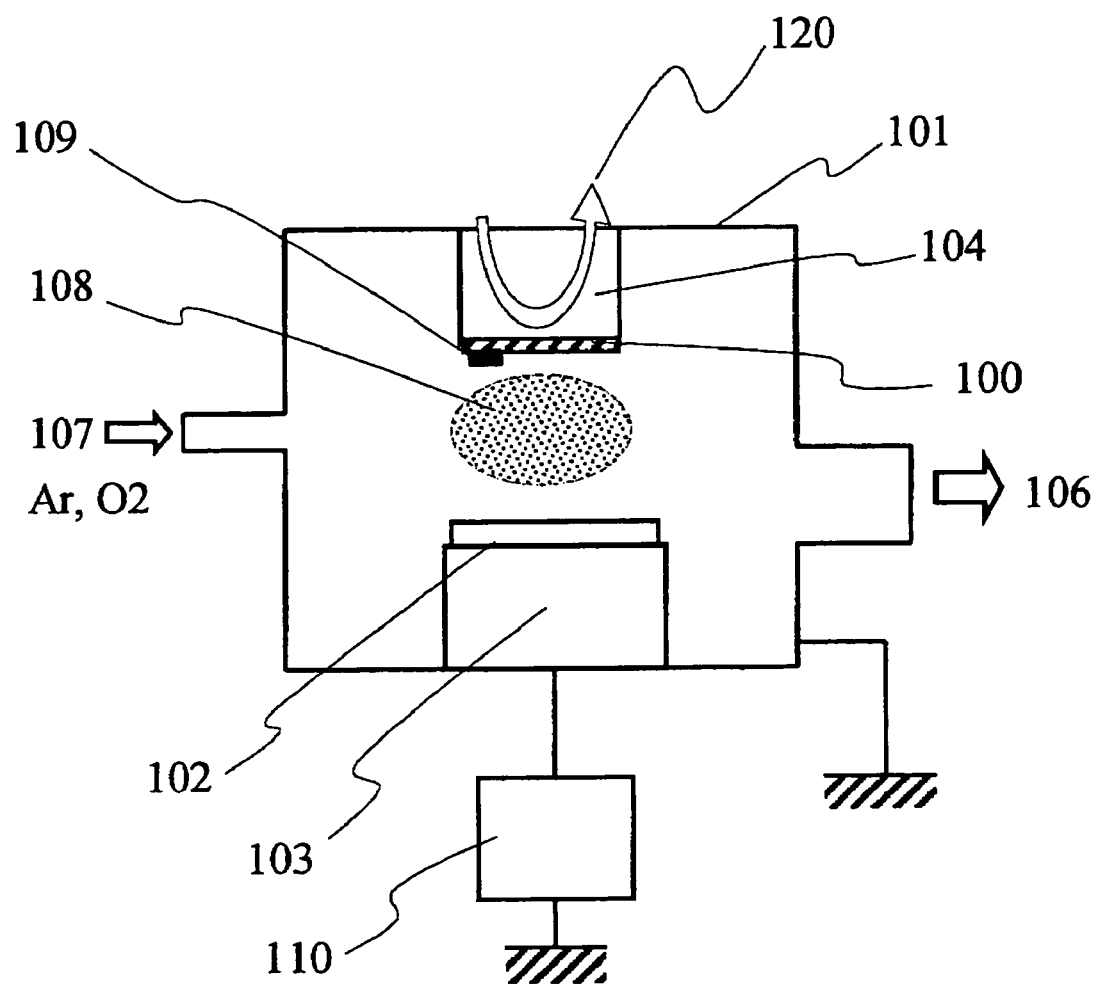
FIG. 4 is a schematic view showing the main part configuration of a production apparatus suitable for use in the method of producing a photocatalytic film in accordance with the invention.

FIG. 4 is a schematic view showing the main part configuration of a production apparatus suitable for use in the method of producing a photocatalytic film in accordance with the invention. More specifically, this apparatus is a sputtering apparatus in which a target 102 primarily composed of metals such as titanium is provided in connection with a cathode 103 inside a vacuum chamber 101. On the other hand, at an anode 104 side, a substrate 100 to deposit a photocatalytic film thereon is installed.

In forming a film, first, the chamber 101 is evacuated by an evacuation pump 106 and a discharge gas of argon (Ar) and oxygen ($O_2$) is introduced from a gas supply source 107. An electric field is then applied between the anode 104 and the cathode 103 by means of an electric power source 110 to start plasma discharge 108. Subsequently, the surface of the target 102 is sputtered and metal titanium and oxygen are bonded on the substrate 100 to form a titanium oxide film 10. In this case, the electric power to be input from the electric power source 110 may be DC (direct current) power or RF (radio frequency) power.

In addition, the anode 104 holding the substrate 100 is provided with a cooling mechanism 120, which can cool the substrate 100 during, before or after sputtering and maintain the substrate 100 within a predetermined temperature range. The cooling mechanism 120 may have, for example, a structure for passing cooling thermal medium such as water and chlorofluorocarbon-based insulating fluid. Alternatively, instead of these fluids, gas may be passed as cooling medium.

If, before sputtering, the substrate is preheated for degassing or other treatments, or the buffer layer 20 is deposited, then the temperature of the substrate 100 is at a higher temperature than room temperature. In such a case, the cooling mechanism 120 can be used to cool the substrate 100 to a predetermined temperature, before starting deposition of metal oxides, as described later in detail.

In the sputtering apparatus as described above, a thin film of amorphous metal oxide can be obtained by adjusting the input electric power for plasma discharge, the pressure and the composition of the ambient gas during sputtering, and the temperature of the substrate.

The inventors have made a detailed investigation on the film formation condition in the situation that, in the configuration of FIG. 4, metal titanium is used for the target 102, oxygen gas ($O_2$) and argon (Ar) are introduced from the gas supply source 107, and reactive sputtering is used to deposit titanium oxide.

In the specific examples described below, a photocatalytic film is formed by a DC sputtering method using a DC power source unless otherwise specifically stated. Further, during sputtering, the substrate 100 is kept in a floating state with respect to the chamber 101 (at a ground potential). The temperature of the substrate 100 is checked by sticking a thermolabel 109 to the substrate.

In order to obtain amorphous metal oxides as illustrated in FIG. 3, it is desirable that the temperature of the substrate 100 is kept low, and that the film formation rate is increased.

Figure 5:
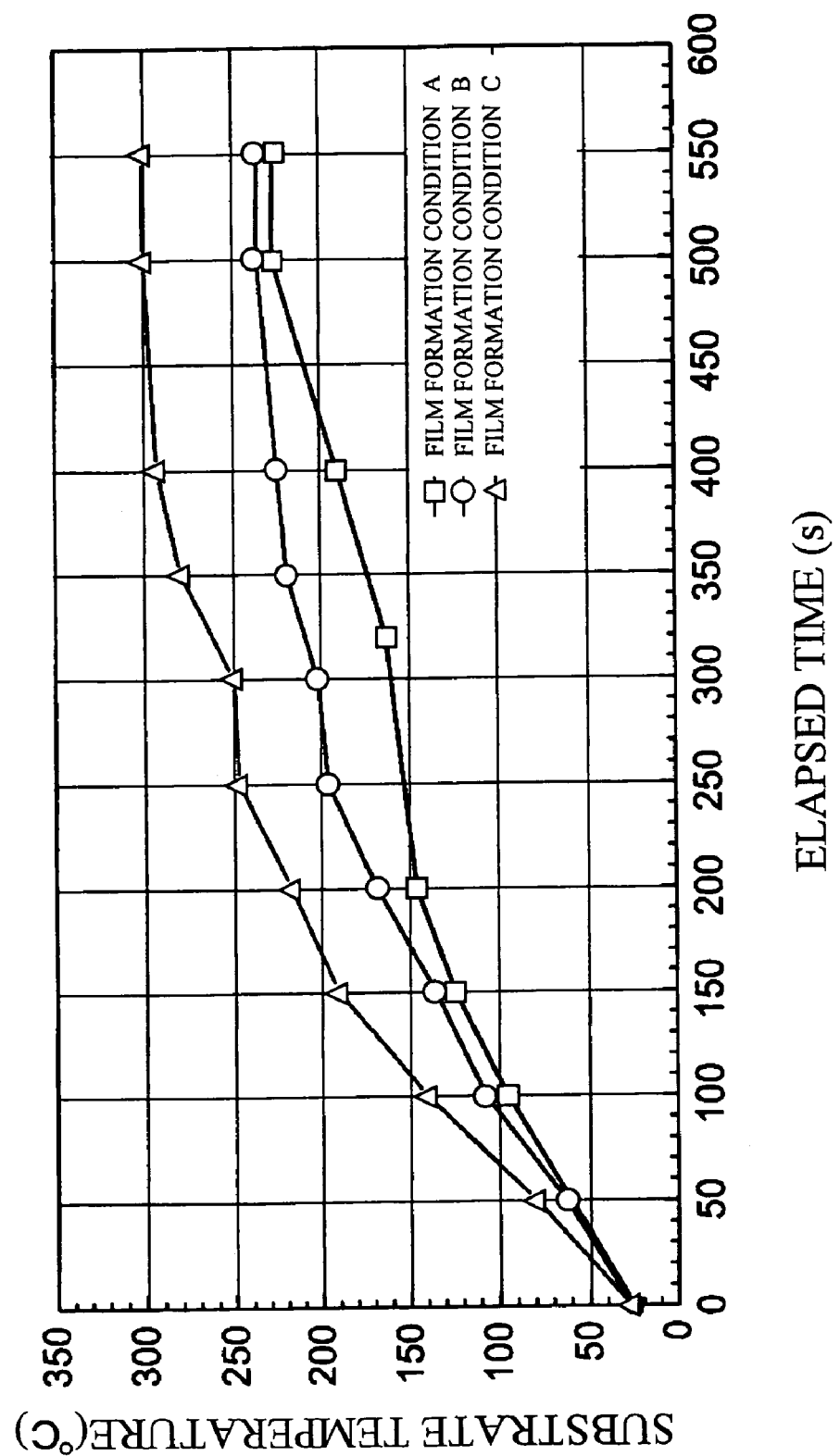
FIG. 5 is a graphical diagram illustrating the temperature variation of a substrate 100 during sputtering.

FIG. 5 is a graphical diagram illustrating the temperature variation of a substrate 100 during sputtering. This shows, for film formation conditions A to C, the temperature variation observed when sputtering the substrate 100 is started at room temperature. The respective conditions are as follows.

| Condition | Input DC electric power | Deposition rate | Total pressure | Oxygen addition ratio |
|---|---|---|---|---|
| A | 2 kW | 18 nm/min | 1 Pa | 30% |
| B | 2 kW | 22 nm/min | 3.5 Pa | 30% |
| C | 3 kW | 36 nm/min | 5 Pa | 30% |

As can be seen from FIG. 5, in the case of starting sputtering the substrate 100 at room temperature, the temperature of the substrate tends to be increased with time owing to heat radiation from the sputtering source and to reach a saturation temperature depending on the input electric power.

The saturation temperature depends mainly on the input electric power. It is about 230° C. when the electric power is 2 kW, and about 300° C. when the electric power is 3 kW.

However, in accordance with the invention, since a thin film having a small thickness is formed, the deposition of the thin film is finished well before the temperature reaches the saturation temperature. For example, since the deposition rate of Condition C is 36 nm/min, it takes about 40 minutes to form a titanium oxide film with a film thickness of 25 nm, so that the maximum temperature of the substrate 100 in the case of starting the deposition at room temperature is 50° C. or less. Metal oxides deposited at a high rate and a low temperature are made amorphous, as illustrated in FIG. 3.

Figure 6:
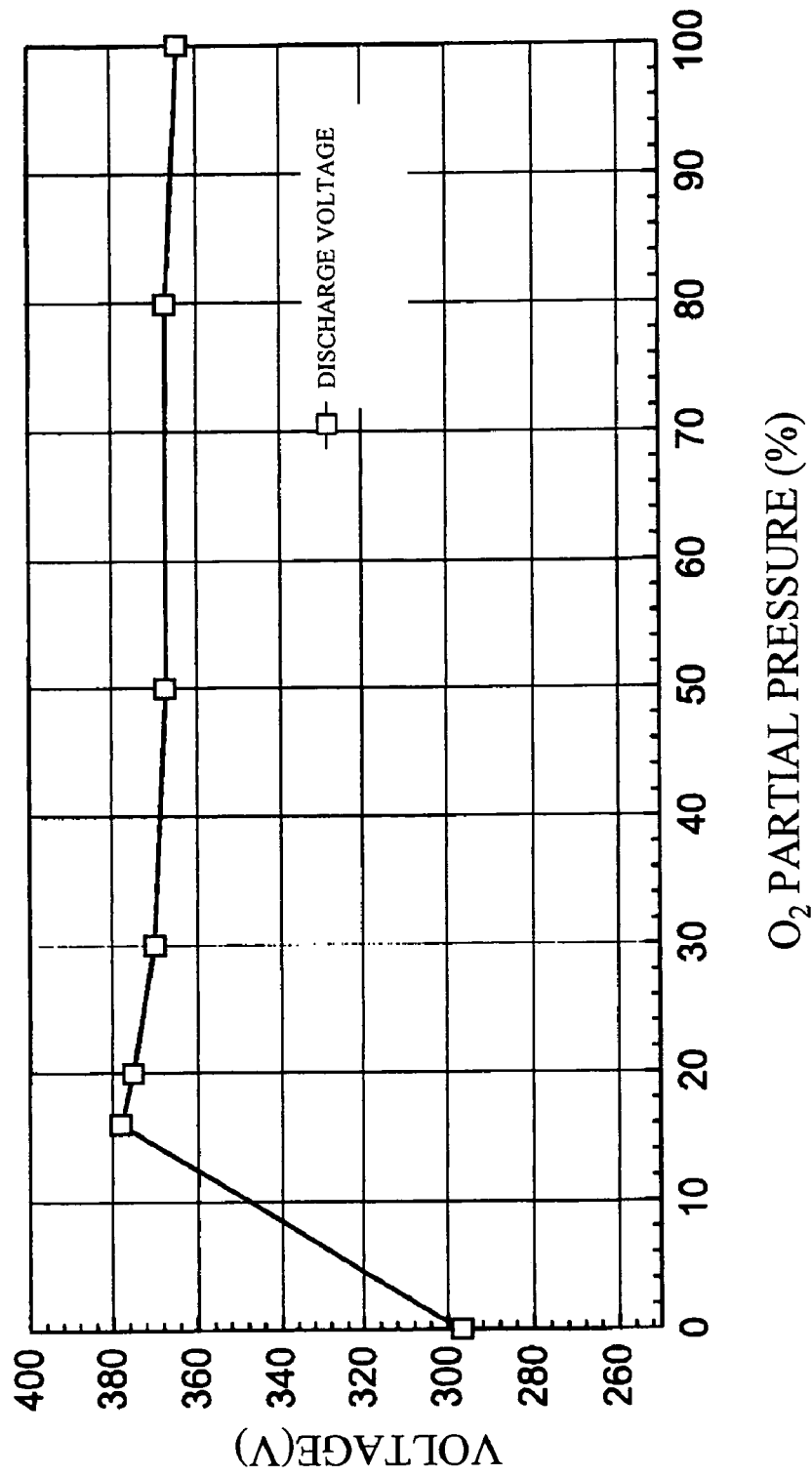
FIG. 6 is a graphical diagram showing the relationship between the oxygen addition ratio and the discharge voltage in the reactive sputtering method for titanium oxide.

FIG. 6 is a graphical diagram showing the relationship between the oxygen addition ratio and the discharge voltage in the reactive sputtering method for titanium oxide. More specifically, the figure shows the voltage generated between the target 102 and the substrate 100 when the input DC electric power is 2 kW and the total pressure during sputtering is 1 Pa in the sputtering apparatus as illustrated in FIG. 4.

As can be seen from FIG. 6, the discharge voltage is rapidly increased upon introduction of oxygen. This is because the surface of the titanium (Ti) target 102 is oxidized. Subsequently, when the oxygen addition ratio reaches a certain level, the surface of the target 102 is maintained at a state of being covered with oxide film, so that the discharge voltage exhibits a constant value.

Figure 7:
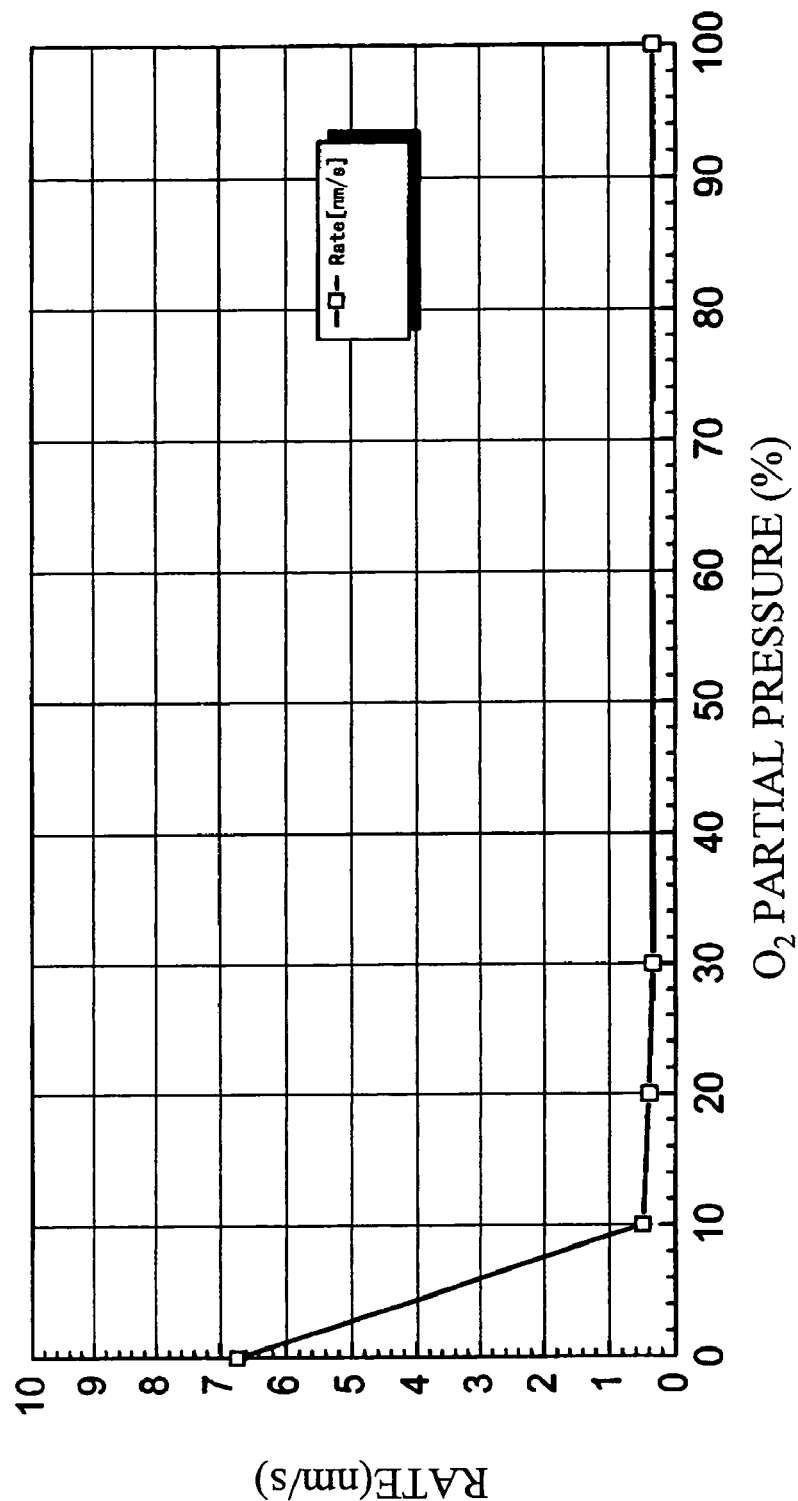
FIG. 7 is a graphical diagram showing the relationship between the oxygen addition ratio and the deposition rate in the reactive sputtering method for titanium oxide.

FIG. 7 is a graphical diagram showing the relationship between the oxygen addition ratio and the deposition rate in the reactive sputtering method for titanium oxide. More specifically, the figure shows the relationship of the deposition rate of titanium oxide film versus the oxygen addition ratio, obtained when the input DC electric power is 2 kW and the total pressure during sputtering is 1 Pa in the sputtering apparatus as illustrated in FIG. 4.

As can be seen from FIG. 7, the deposition rate is high when the oxygen addition ratio is less than about 10%, and the deposition rate becomes substantially constant when the oxygen addition ratio exceeds 10%. This generally corresponds to the variation of the discharge voltage shown in FIG. 6. Presumably, this is because the surface condition of the titanium target 102 is varied according to the oxygen addition ratio.

More specifically, under the condition of low oxygen addition ratio, the surface of the titanium target 102 is not sufficiently oxidized, which results in a high sputtering ratio and thus increases the deposition rate of the thin film. In contrast, when the oxygen addition ratio exceeds a certain level, the surface of the titanium target 102 is substantially covered with oxide film, which results in a low sputtering ratio and thus decreases the deposition rate of the thin film.

However, as described later in detail, the photocatalysis of the finally obtained photocatalytic film is good as well when the oxygen addition ratio during the film formation is 10% or higher.

The specific examples of the process of depositing an amorphous metal oxide (step S1) have been described with reference to FIGS. 3 to 7.

Returning to FIG. 2, in accordance with the invention, the amorphous metal oxide thus obtained is subjected to heat treatment in an atmosphere containing oxygen (step S2). This heat treatment may be carried out in an atmosphere controlled by mixing oxygen and other gases in a predetermined proportion. In practice, however, the heat treatment is most easily and reliably carried out in the normal atmosphere. Therefore, the description will be focused on the situation where the heat treatment is carried out in the normal atmosphere.

Figure 8:
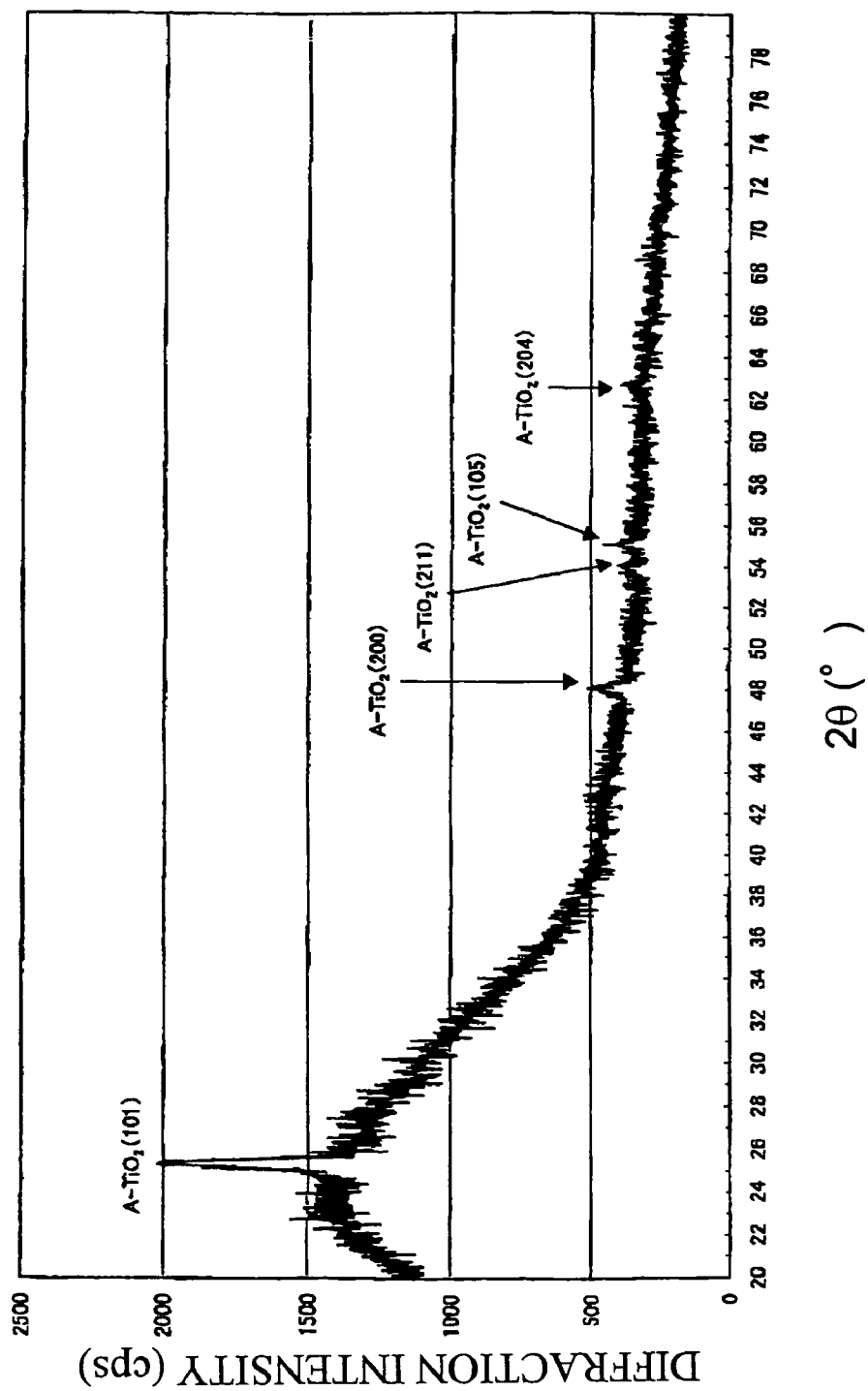
FIG. 8 is a graphical diagram showing a typical example of an X-ray diffraction pattern determined after an amorphous metal oxide similar to that shown in FIG. 3 is subjected to heat treatment.

FIG. 8 is a graphical diagram showing a typical example of an X-ray diffraction pattern determined after an amorphous metal oxide similar to that shown in FIG. 3 is subjected to heat treatment. More specifically, the figure is obtained by five cumulative measurements of the X-ray diffraction pattern using the grazing incidence method after an amorphous titanium oxide film having a thickness of about 50 nm is subjected to heat treatment in the normal atmosphere at 600° C. for 60 minutes.

As seen in FIG. 8, crystalline peaks are observed on a halo background as in FIG. 3. These peaks correspond to (101), (200), (211), (105), and (204) diffraction peaks of titanium oxide ($TiO_2$) having an anatase structure. In other words, it is appreciated that as a result of the heat treatment, crystal grains having a size on the order of X-ray coherent length or greater are formed. Titanium oxide having such an anatase structure is a semiconductor with a band gap of about 3.2 eV and exhibits photocatalysis.

The inventors evaluated the photocatalysis of the obtained photocatalytic film 10 by "wax decomposition hydrophilization test". The test is for evaluating both of "decomposition effect" and "hydrophilization effect" among photocatalytic effects of the photocatalytic film 10. The "decomposition effect" is an effect of decomposing an organic material such as wax by active oxygen species such as hydroxyl radicals and superoxides formed on the surface of photocatalytic film. The "hydrophilization effect" is an effect of improving the hydrophilicity of the surface of photocatalytic film. The contents of the wax decomposition hydrophilization test carried out by the inventors are generally as follows.

(1) The surface of the photocatalytic film 10 is washed with a neutral detergent to be made hydrophilic.

(2) A solid wax is applied to the surface of the photocatalytic film 10 and dried at room temperature for one hour. The solid wax used here is Hero (trade name, manufactured by SurLuster Inc.), primarily composed of carnauba wax.

(3) The surface of the photocatalytic film 10 is washed with a neutral detergent and then dried at 50° C.

(4) The contact angle of a water droplet formed on the surface of the photocatalytic film 10 is measured periodically while continuously irradiating a black light beam (BLB). The wax provided on the surface of the photocatalytic film 10 is decomposed by photocatalysis due to irradiation of black light. When the wax remains on the surface, the contact angle of the water droplet is large. However, when the wax is decomposed, the contact angle of the water droplet becomes small.

Therefore, it can be said that the photocatalysis is more active when the contact angle is small even if the irradiation intensity of black light is small or when the contact angle of the water droplet is small after a predetermined duration of irradiation.

Figure 9:
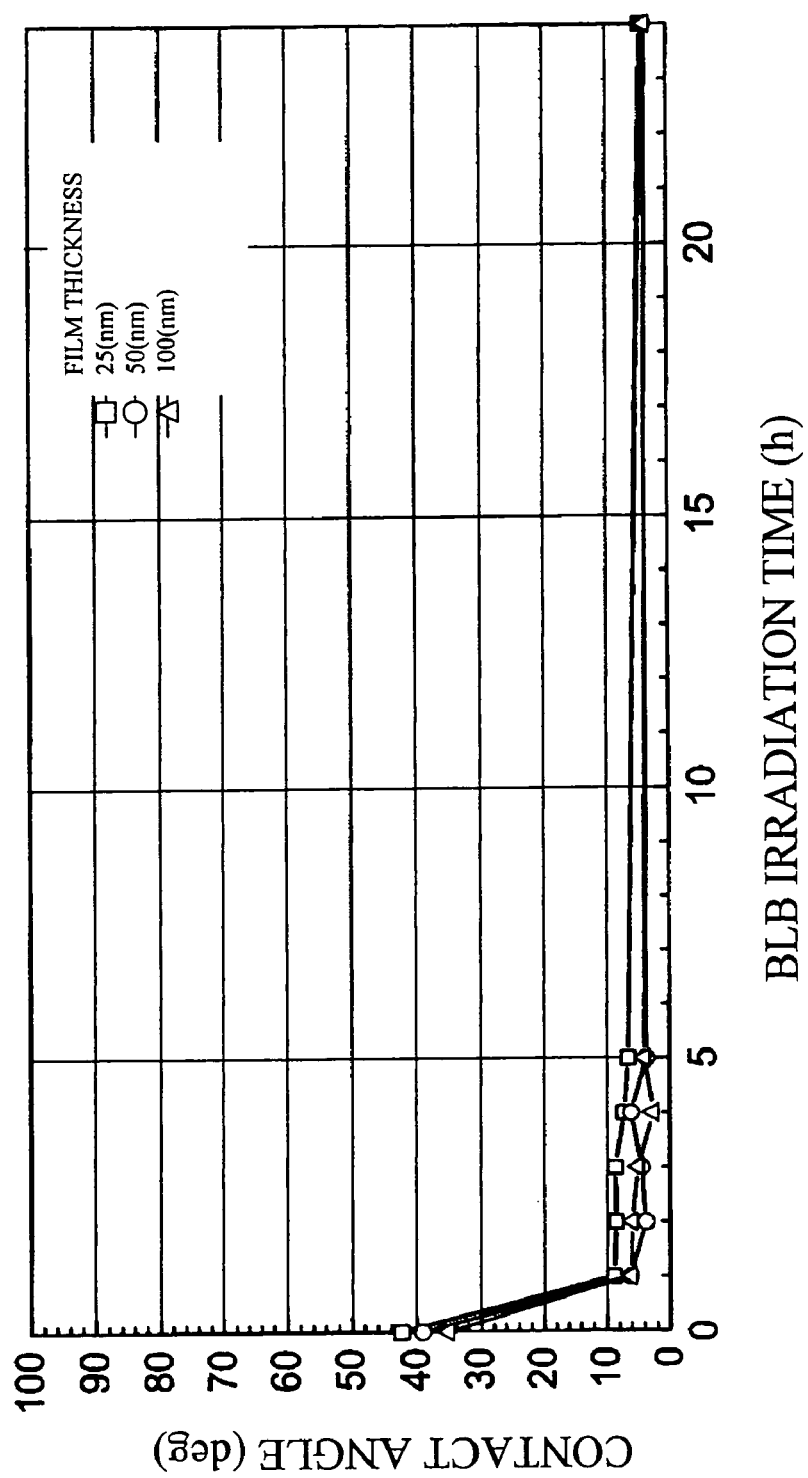
FIG. 9 is a graphical diagram showing an example of the results of a wax decomposition and hydrophilization test for the photocatalytic film 10 produced in accordance with the invention.

FIG. 9 is a graphical diagram showing an example of the results of a wax decomposition and hydrophilization test for the photocatalytic film 10 produced in accordance with the invention. More specifically, in the figure, the horizontal and vertical axes represent the irradiation time of black light and the contact angle of the water droplet, respectively. For the photocatalytic film 10, three samples of titanium oxide having a film thickness of 25 nm, 50 nm, and 100 nm, respectively, are plotted.

These samples are prepared by forming an amorphous titanium oxide film under Condition B described in connection with FIG. 5, that is, the condition that the input electric power is 2 kW, the total pressure is 3.5 Pa and the oxygen addition ratio is 10%, and then applying heat treatment in the normal atmosphere at 600° C. for 60 minutes. In this case, the irradiation intensity of black light is set to 50 µW/cm$^2$.

As seen in FIG. 9, in any of the samples irrespective of the film thickness, the contact angle rapidly decreases upon irradiation of black light, and falls below 10 degrees after one hour. After five hours, it decreases to 4 degrees for 50-nm and 100-nm samples, and after 25 hours for all the samples. In other words, it is appreciated that a remarkable photocatalysis is obtained upon irradiation of light.

In addition, it is appreciated that even in an extremely thin sample having a film thickness of 25 nm, the contact angle falls below 10 degrees after one-hour irradiation of light, achieving a good photocatalysis. With such a small film thickness, the film formation time can be reduced to yield a high productivity. Furthermore, the film thickness is smaller than the wavelength band of visible light by nearly one order of magnitude, so that "color mottling" can be eliminated. As a result, for example, a good field of vision can be ensured even in applications such as rearview mirrors for an automobile and vapor-proof mirrors and windowpanes for a bath room, which is an extremely great advantage.

It is to be noted that in the data shown in FIG. 9, the irradiation intensity of black light is set to 50 µW/cm$^2$. Typically, however, in such a wax decomposition hydrophilization test, the irradiation intensity of black light is often set to 500 µW/cm$^2$. That is, it is also noteworthy that in accordance with the invention, a good decomposition property is achieved even if the selected intensity is lower than the typical condition by one order of magnitude.

The relationship between the photocatalysis evaluated by a similar wax decomposition hydrophilization test and the formation condition of the photocatalytic film will now be described.

Figure 10:
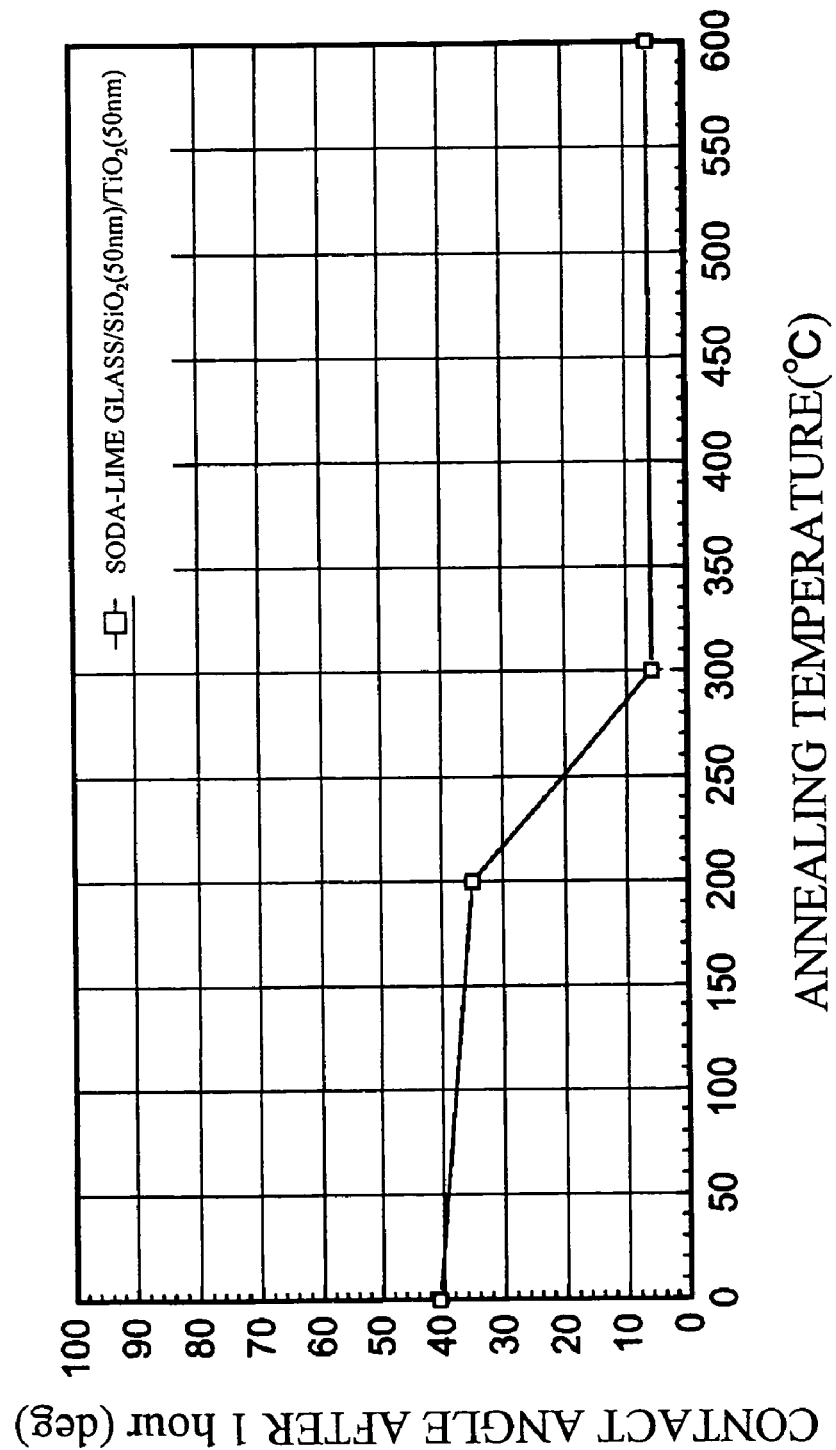
FIG. 10 is a graphical diagram showing the relationship between the heat treatment temperature and the photocatalysis.

FIG. 10 is a graphical diagram showing the relationship between the heat treatment temperature and the photocatalysis. More specifically, in the figure, the horizontal axis represents the heat treatment temperature of titanium oxide films. The vertical axis represents the contact angle determined after the resulting photocatalytic films are evaluated by the wax decomposition hydrophilization test and black light is irradiated for one hour.

Each of the photocatalytic films evaluated here is a titanium oxide film formed by the reactive sputtering method on a soda-lime glass with a buffer layer 20 of silicon oxide being interposed in between. The thickness of the silicon oxide buffer layer and the titanium oxide layer is set to 50 nm each. The film formation condition is such that the input DC electric power is 2 kW, the total pressure is 3.5 Pa, and the oxygen addition ratio is 10%. In each case, heat treatment is applied in the normal atmosphere for 60 minutes.

As seen in FIG. 10, when the heat treatment temperature exceeds 200° C., the contact angle decreases, which indicates that the photocatalysis becomes active. At heat treatment temperatures of 300° C. or higher, the contact angle after one-hour irradiation of black light decreases to 6 degrees, which indicates that an extremely active photocatalysis is achieved. Presumably, this corresponds to the formation of crystalline titanium oxide having an anatase structure from the amorphous titanium oxide.

The relationship between the sputtering film formation condition and the photocatalytic property will now be described.

Figure 11:
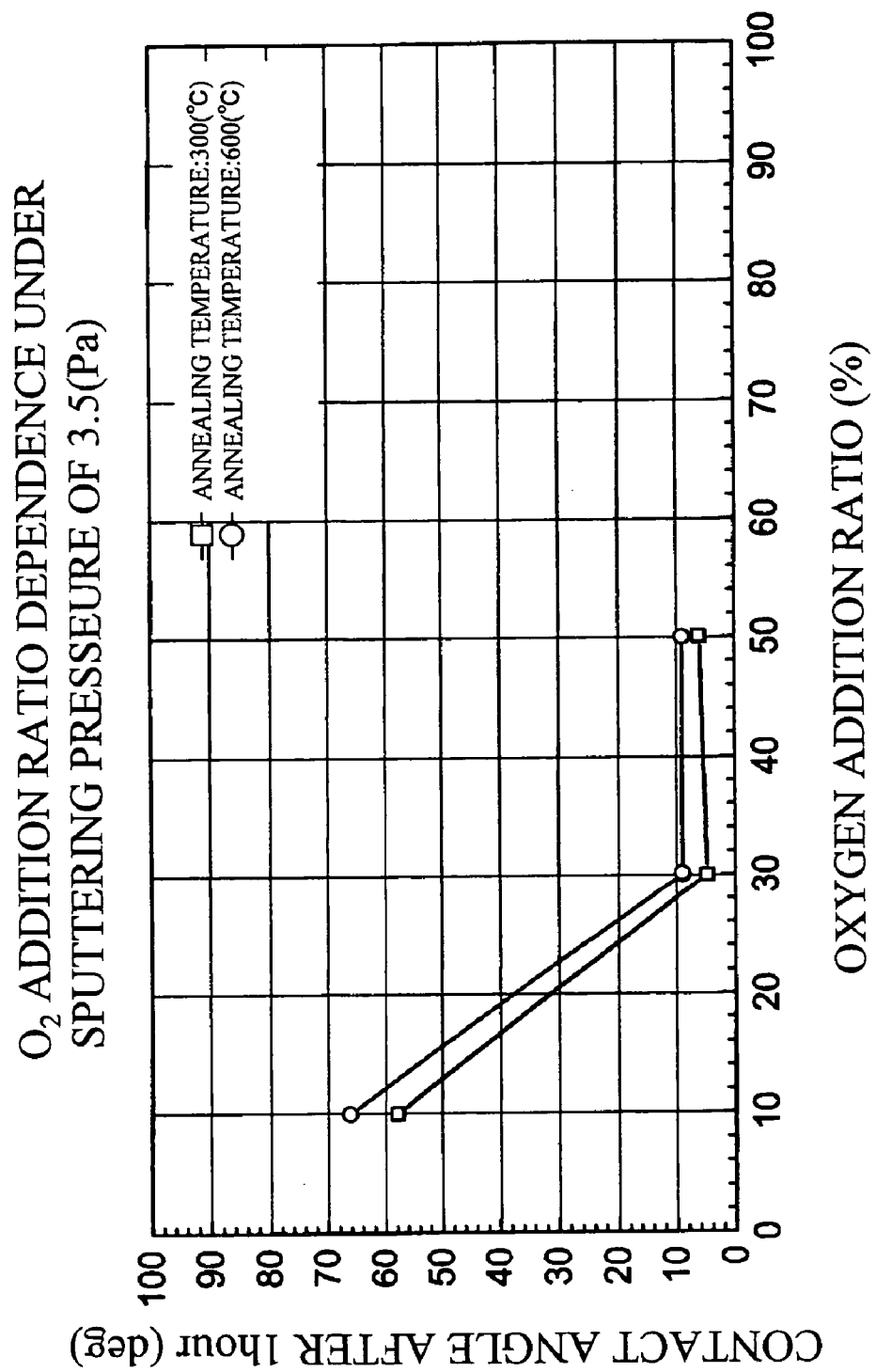
FIG. 11 is a graphical diagram showing the relationship between the oxygen addition ratio and the photocatalytic property for a total pressure during sputtering of 1 Pa.

FIG. 11 is a graphical diagram showing the relationship between the oxygen addition ratio and the photocatalytic property for a total pressure during sputtering of 1 Pa. More specifically, the figure shows a result of evaluating, by the wax decomposition hydrophilization test, samples in which a titanium oxide layer is formed on a soda-lime glass with a silicon oxide buffer layer being interposed in between. In this case, the thickness of the silicon oxide buffer layer and the titanium oxide layer is set to 50 nm each. The film formation condition is such that by the DC sputtering method, the input electric power is 2 kW, and the total pressure during sputtering is 1 Pa. Data are plotted for a heat treatment time of 60 minutes and a heat treatment temperature of 300° C. and 600° C., respectively.

As seen in FIG. 11, under a total pressure of 1 Pa, the contact angle of the resulting photocatalytic film is as high as about 60 degrees when the oxygen addition ratio is 10%. When the oxygen addition ratio is increased to 30%, the contact angle decreases to 10 degrees or less. When the oxygen addition ratio is further increased to 50%, the contact angle remains to be 10 degrees or less.

In other words, in the range of oxygen addition ratio above 10%, a good photocatalysis is achieved. Presumably, under a total pressure of 1 Pa, the oxygen addition ratio of 10% or less may make the oxygen content insufficient in the resulting titanium oxide film.

Figure 12:
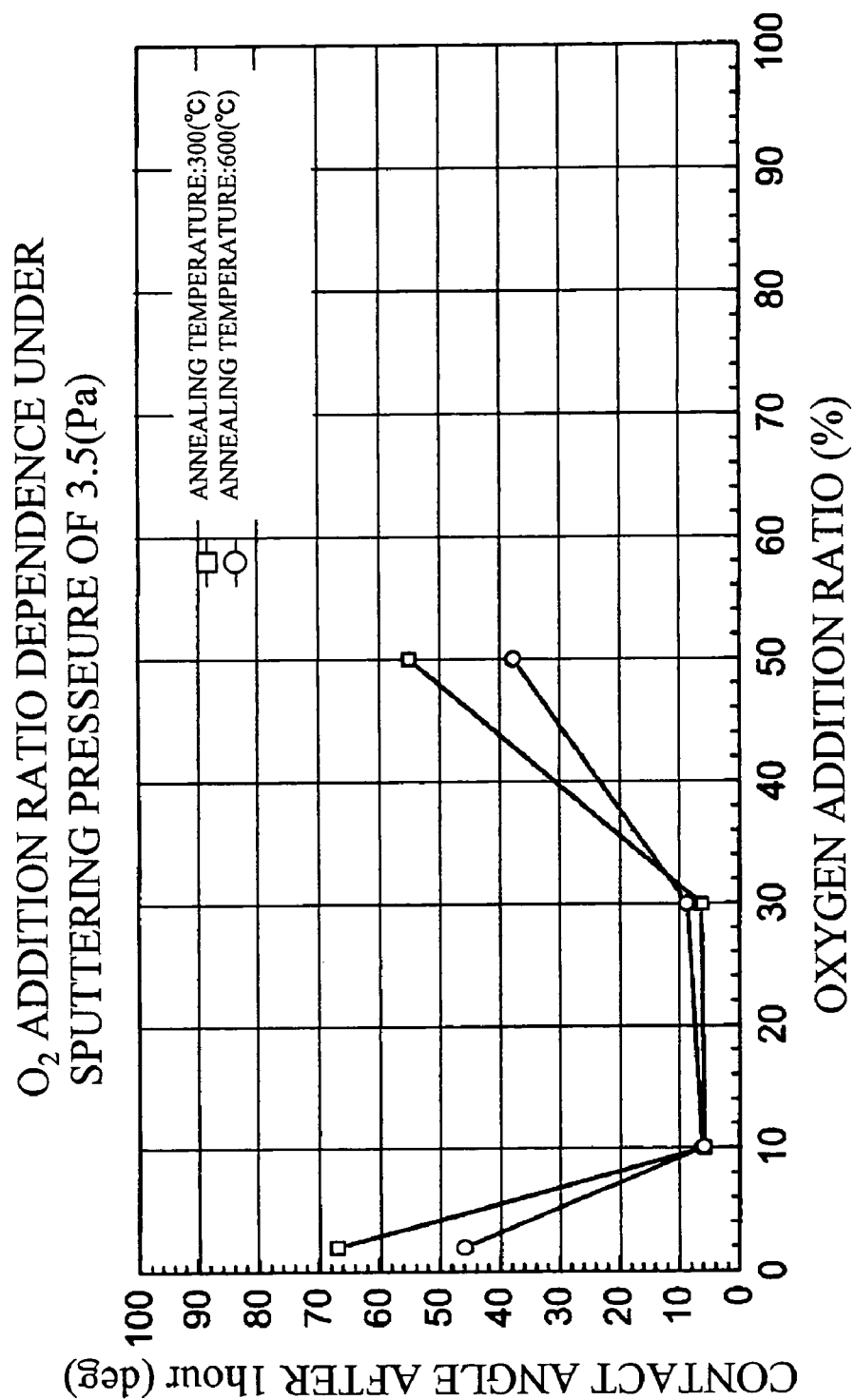
FIG. 12 is a graphical diagram showing the relationship between the oxygen addition ratio and the photocatalytic property for a total pressure during sputtering of 3.5 Pa.

FIG. 12 is a graphical diagram showing the relationship between the oxygen addition ratio and the photocatalytic property for a total pressure during sputtering of 3.5 Pa. In this figure, the conditions except for the total pressure are the same as in FIG. 11.

As seen in FIG. 12, under a total pressure of 3.5 Pa, the contact angle of the photocatalytic film is less than 10 degrees when the oxygen addition ratio is in the range of above 0.2% and below 50%, achieving a good photocatalysis. This tendency is nearly identical whether the heat treatment temperature is 300° C. or 600° C. Presumably, under a total pressure of 3.5 Pa, the oxygen content in the resulting titanium oxide may become insufficient when the oxygen addition ratio is 0.2% or less, and the film quality of the formed titanium oxide film may be deteriorated when the oxygen addition ratio is 50% or greater.

Figure 13:
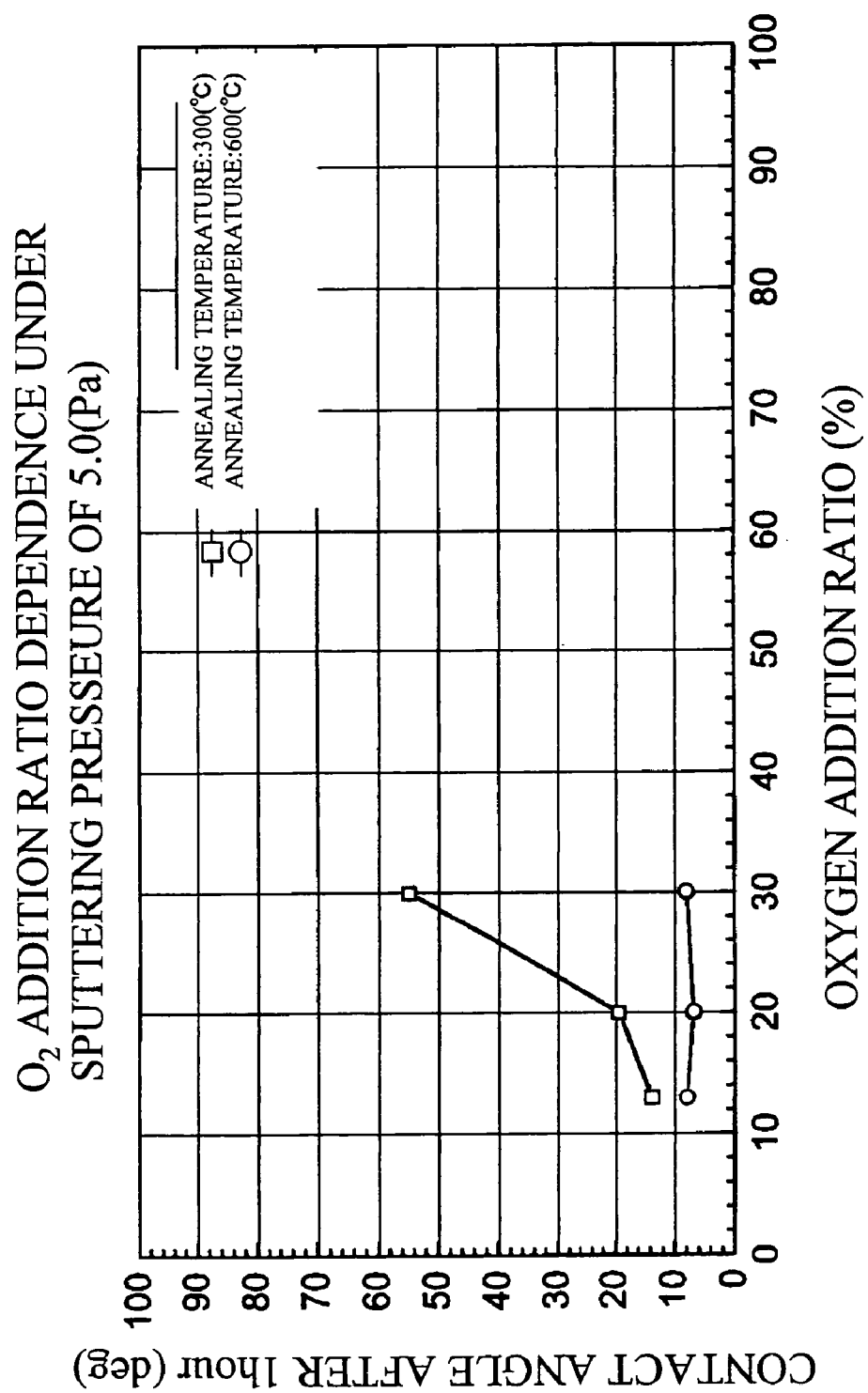
FIG. 13 is a graphical diagram showing the relationship between the oxygen addition ratio and the photocatalytic property for a total pressure during sputtering of 5 Pa.

FIG. 13 is a graphical diagram showing the relationship between the oxygen addition ratio and the photocatalytic property for a total pressure during sputtering of 5 Pa. Also in this figure, the conditions except for the total pressure are the same as in FIGS. 11 and 12.

As seen in FIG. 13, at a heat treatment temperature of 300° C., the contact angle increases as the oxygen addition ratio increases from 13% to 30%. In contrast, at a heat treatment temperature of 600° C., the contact angle is less than 10 degrees when the oxygen addition ratio is in the range of 13% to 30%, achieving a good photocatalysis.

Presumably, the degree of amorphism is greater in the resulting titanium oxide film when the total pressure is increased up to 5 Pa. In other words, the degree of disorder of the atomic arrangement in the titanium oxide film may increase, or many defects may be introduced. In addition, it is presumed that the film quality is further deteriorated when an excessive quantity of oxygen is added during sputtering. Therefore, in order to obtain crystal grains by heat-treating these thin films, a higher heat treatment temperature is required. It is then presumed that the oxygen addition ratio in the sputtering atmosphere tends to be excessive in the heat treatment at 300° C.

Figure 14:
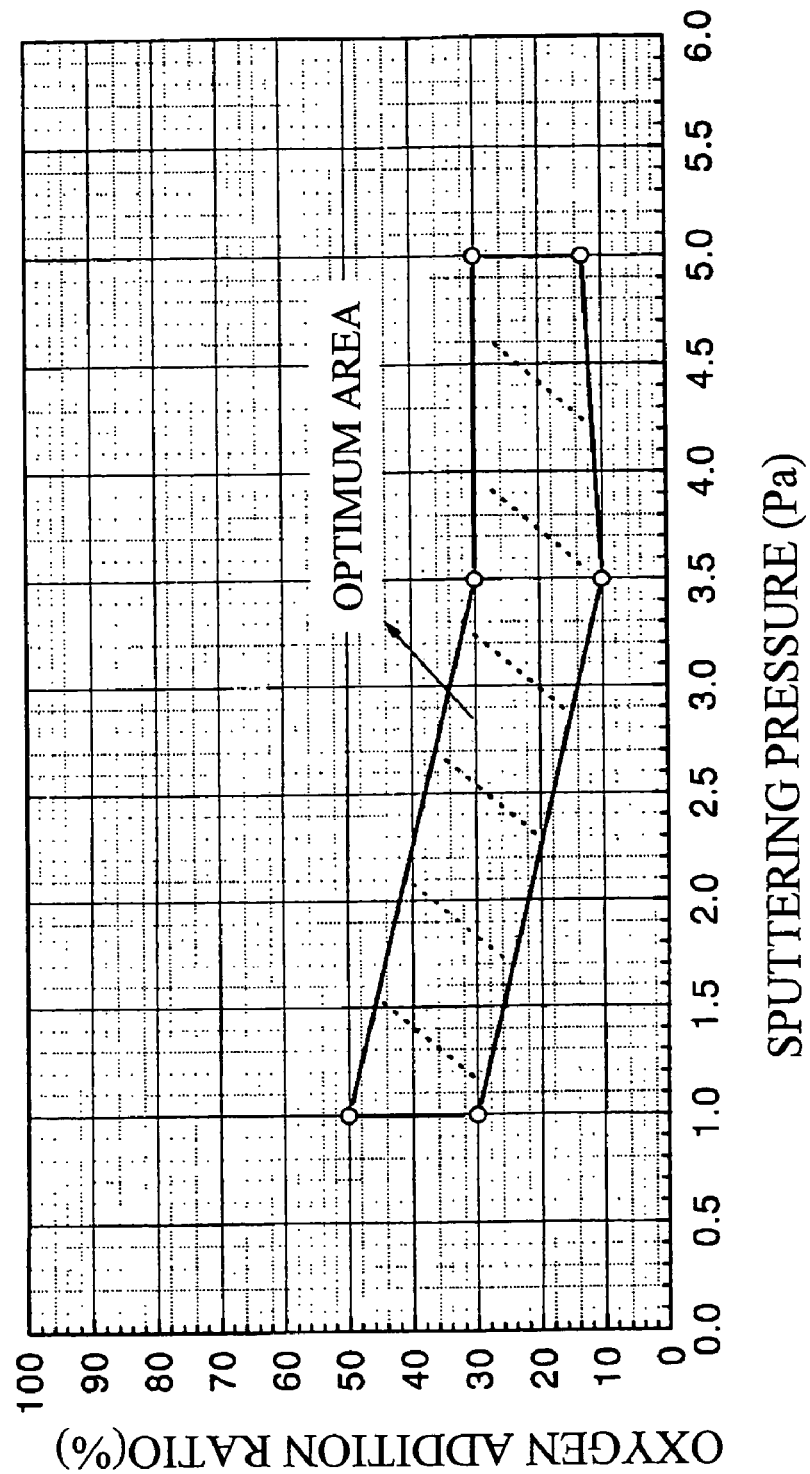
FIG. 14 is a graphical diagram summarizing the results shown in FIGS. 11 to 13.

FIG. 14 is a graphical diagram summarizing the results shown in FIGS. 11 to 13. More specifically, in the figure, the horizontal and vertical axes represent the total pressure during sputtering and the oxygen addition ratio, respectively. The hatched portion in the figure, surrounded by the plot, corresponds to a region in which a good result was achieved in the wax decomposition hydrophilization test. In other words, if a titanium oxide film is formed using a condition in this region, a good photocatalytic property can be achieved by subsequent heat treatment.

The oxygen addition ratio for a total pressure during sputtering of 1 Pa, 3.5 Pa, and 5 Pa has been described, respectively. However, these results can be summarized in terms of "oxygen partial pressures" during sputtering.

Figure 15:
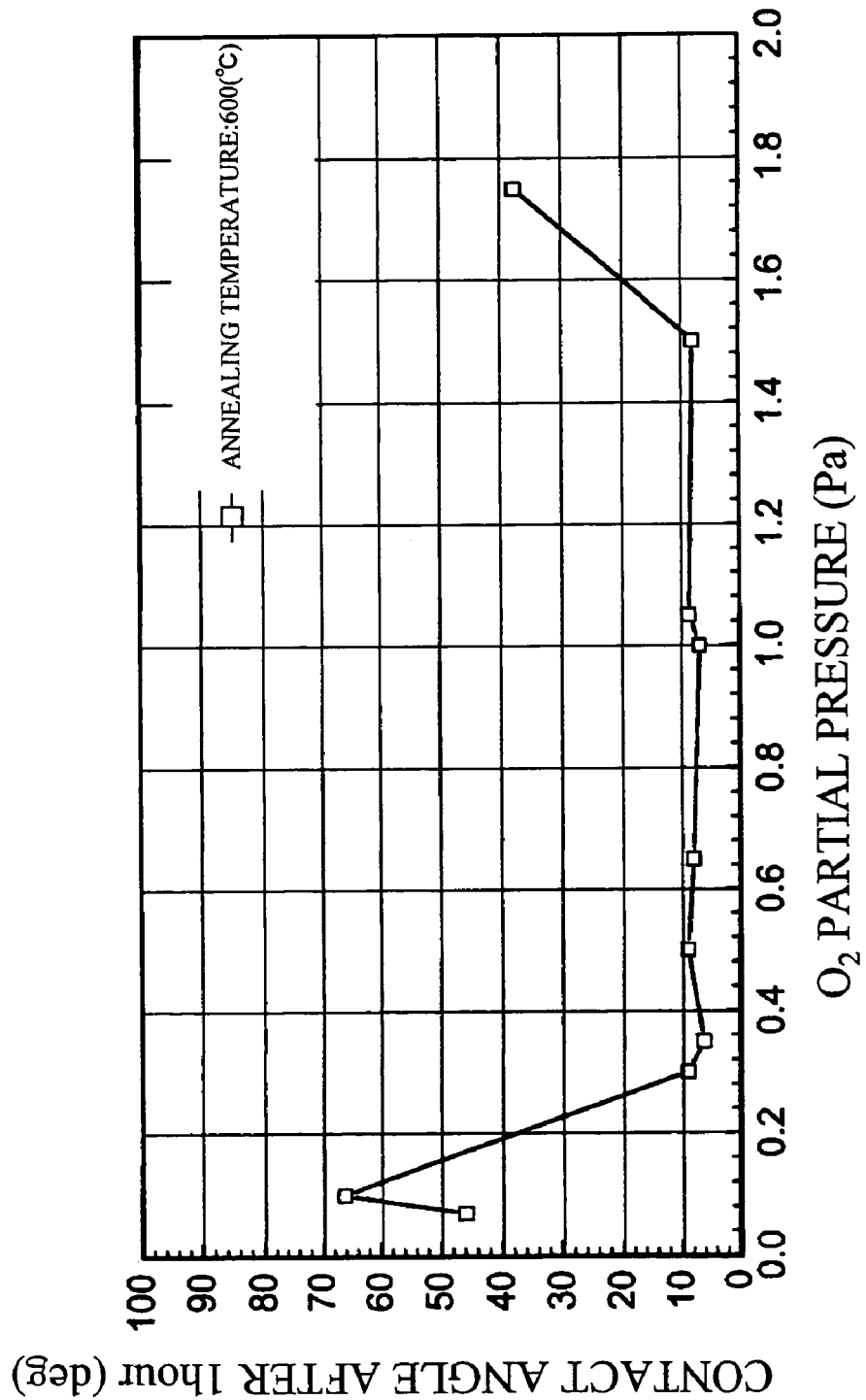
FIG. 15 is a graphical diagram showing the relationship between the oxygen partial pressure during sputtering and the photocatalytic property.

FIG. 15 is a graphical diagram showing the relationship between the oxygen partial pressure during sputtering and the photocatalytic property. More specifically, the figure shows a graph in which the data for a heat treatment temperature of 600° C. shown in FIGS. 11 to 14 are collectively plotted. As seen in FIG. 15, a good photocatalytic property can be achieved in the range of oxygen partial pressure above 0.1 Pa and below 1.75 Pa, irrespective of the total pressure during sputtering.

The inventors examined these samples in terms of the composition ratio between titanium (Ti) and oxygen (O) using Electron Spectroscopy for Chemical Analysis (ECSA). The occurrence ratio for the peaks obtained by the measurement is summarized as follows:

| Sample No. | Oxygen partial pressure | $Ti_1$ | $Ti_2$ | $Ti_3$ | $Ti_4$ |
|---|---|---|---|---|---|
| 1 | 0.1 Pa | 12 | 5 | 17 | 66 |
| 2 | 0.3 Pa | 1 | 1 | 1 | 97 |
| 3 | 0.5 Pa | 1 | 1 | 1 | 97 |
| 4 | 1.5 Pa | 1 | 1 | 2 | 96 |
| 5 | 1.75 Pa | 1 | 1 | 2 | 96 |

The above-described $Ti_1$ to $Ti_4$ represent selected peaks used in the waveform analysis for Ti 2p spectrum, and correspond to the following bonding state, respectively:

| Peak | Bonding state | Peak shape |
|---|---|---|
| $Ti_1$ | Ti | Standard spectrum of metal titanium |
| $Ti_2$ | TiO, etc. | Standard spectrum of metal titanium |
| $Ti_3$ | $Ti_2O_3$, etc. | Standard spectrum of metal titanium |
| $Ti_4$ | $TiO_2$, etc. | Standard spectrum of $TiO_2$ |

As seen in this result, in Sample 1, the occurrence ratio for $Ti_4$ peak corresponding to $TiO_2$ is as low as 66%, the occurrence ratio for $Ti_1$ peak corresponding to metal titanium Ti is 12%, the occurrence ratio for $Ti_2$ peak corresponding to TiO is 5%, and the occurrence ratio for $Ti_3$ peak corresponding to $Ti_2O_3$ is 17%. In other words, it is appreciated that, denoting the average composition as $TiO_x$, Sample 1 has a composition ratio x as low as about 1.63. As can be seen from FIG. 15, this sample is rather insufficient in photocatalysis.

In contrast, in any of Samples 2 to 4, the occurrence ratio for $Ti_4$ peak corresponding to $TiO_2$ is as high as 96%, and the composition ratio x assuming the average composition $TiO_x$ is 1.96 or higher. This composition ratio is very close to that of $TiO_2$. As shown in FIG. 15, these samples exhibit an extremely active photocatalysis upon application of heat treatment.

It is appreciated from these results that an amorphous titanium oxide is formed, which has a composition ratio x in $TiO_x$ substantially equal to 2, and which exhibits an extremely active photocatalysis upon application of heat treatment.

In addition, with respect to Sample 5, it can be seen that the occurrence ratio for $Ti_4$ peak corresponding to $TiO_2$ is as high as 96%, and the composition ratio x assuming the average composition $TiO_x$ is 1.96 or higher. However, as shown in FIG. 15, even if this sample is subjected to heat treatment, it does not exhibit an active photocatalysis. Presumably, this is because the film quality is deteriorated for reasons of numerous defects being contained and thus semiconductor properties cannot be sufficiently obtained after heat treatment, although the average composition of the resulting titanium oxide is close to the stoichiometric value, even if the film is formed in an atmosphere containing excessive oxygen.

To summarize the above-described results, in order to obtain an active photocatalytic film in accordance with the invention, it is required to form an amorphous titanium oxide film having the stoichiometric composition in an atmosphere where oxygen is not excessive.

In other words, the amorphous titanium oxide film thus formed by sputtering forms a crystal having an anatase structure and exhibits an active photocatalysis. Under an oxygen partial pressure of 0.1 Pa or less, the active photocatalytic property is not obtained because the oxygen content in the resulting titanium oxide film is insufficient. Under an oxygen partial pressure of 1.75 Pa or greater, the active photocatalytic property is not also obtained because the film quality of the resulting titanium oxide film is deteriorated.

As described above, in accordance with the first embodiment of the invention, a crystalline titanium oxide can be formed and an active photocatalysis can be obtained by forming an amorphous titanium oxide film under a predetermined condition and subsequently heat-treating it.

Furthermore, in accordance with the invention, an active photocatalysis can be obtained even from an extremely thin photocatalytic film. This can realize a high productivity and eliminate "color mottling" in the wavelength band of visible light, thereby enabling a wide variety of applications of the photocatalyst.

Now, as a second embodiment of the invention, a method of producing a photocatalyst having a coating layer of silicon oxide or the like on a photocatalytic film will be described.

Figure 16:
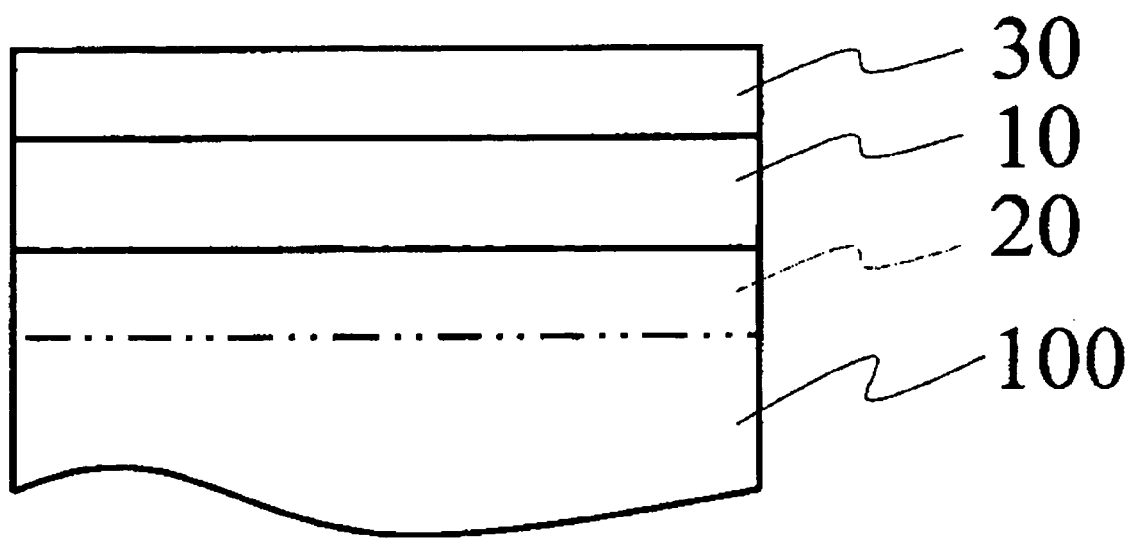
FIG. 16 is a schematic diagram illustrating a cross-sectional structure of a photocatalyst produced in accordance with a second embodiment of the invention.

FIG. 16 is a schematic diagram illustrating a cross-sectional structure of a photocatalyst produced in accordance with a second embodiment of the invention.

More specifically, the photocatalyst in accordance with the present embodiment comprises, as with that described above with reference to FIG. 1, a photocatalytic film 10 on a substrate 100 with a buffer layer 20 of silicon oxide or the like being interposed as appropriate in between. Since the substrate 100, buffer layer 20, and photocatalytic film 10 can be the same as those described above with reference to the first embodiment, they are labeled with like reference numerals and will not be described further in detail.

In the present embodiment, a coating layer 30 is further provided on the photocatalytic film 10.

The coating layer 30 serves to protect the surface of the photocatalytic film 10 to the extent that photocatalysis suffers no interference and to maintain hydrophilicity. More specifically, under light irradiation, as described above with reference to FIGS. 1 to 16, the photocatalytic film 10 exhibits an active photocatalysis and decomposes adherents to maintain high hydrophilicity. However, without light irradiation, photocatalysis of the photocatalytic film 10 stops. In contrast, if a coating layer 30 with a proper film thickness and material is formed, the hydrophilicity obtained by the photocatalytic film 10 can be maintained even in such a dark place. It is desirable to use oxides with good hydrophilicity for the material of the coating layer 30. In addition, in view of stability and durability over time, or light and weather resistance to ultraviolet radiation, it is desirable to use inorganic oxides. Such inorganic oxides may include silicon oxide and aluminum oxide. Experiments by the inventors revealed that use of silicon oxide ($SiO_2$) films having a thickness in the range of several to ten nanometers provides a good result.

Figure 17:
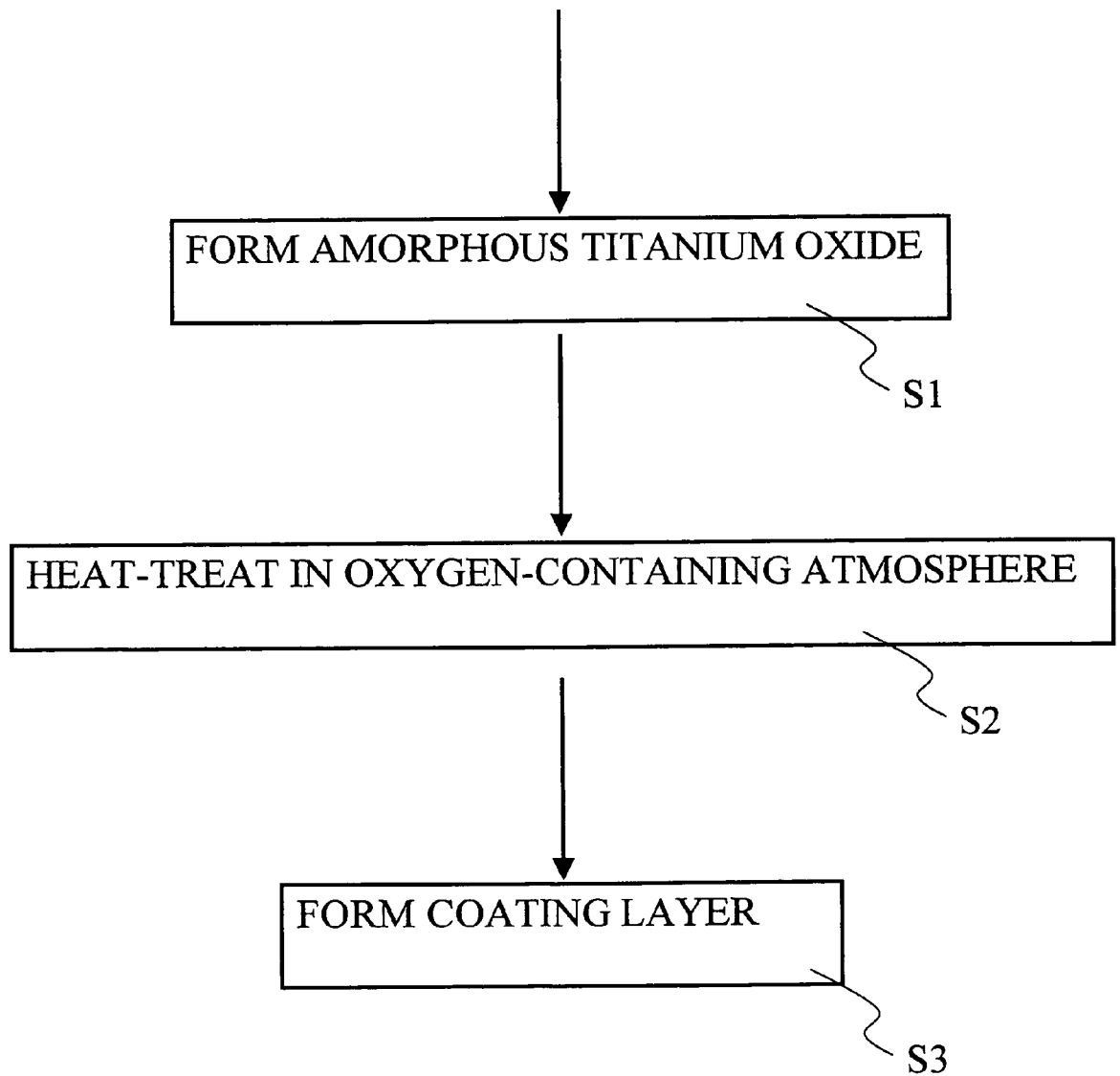
FIG. 17 is a flow chart showing a method of producing a photocatalyst in accordance with an embodiment of the invention.

FIG. 17 is a flow chart showing a method of producing a photocatalyst in accordance with an embodiment of the invention.

In the present embodiment as well, first, at step S1, an amorphous metal oxide layer to be served as a photocatalytic film 10 is formed on a substrate 100 with a buffer layer 20 being interposed in between, or directly on the substrate 100 without any interposition.

Next, at step S2, heat treatment is applied in an atmosphere containing oxygen. The content of these steps S1 and S2 can be the same as those described above with reference to the first embodiment and will not be described in detail.

In the present embodiment, subsequently, at step S3, the coating layer 30 is formed. The production method in accordance with the present embodiment is characterized in one respect by the sequence in which these steps S2 and S3 are carried out. In other words, as a method of producing a photocatalyst as shown in FIG. 16, another sequence could be envisaged which comprises depositing an amorphous metal oxide to be served as a photocatalytic film 10, followed by further depositing a coating layer 30, and then applying heat treatment.

Figure 18:
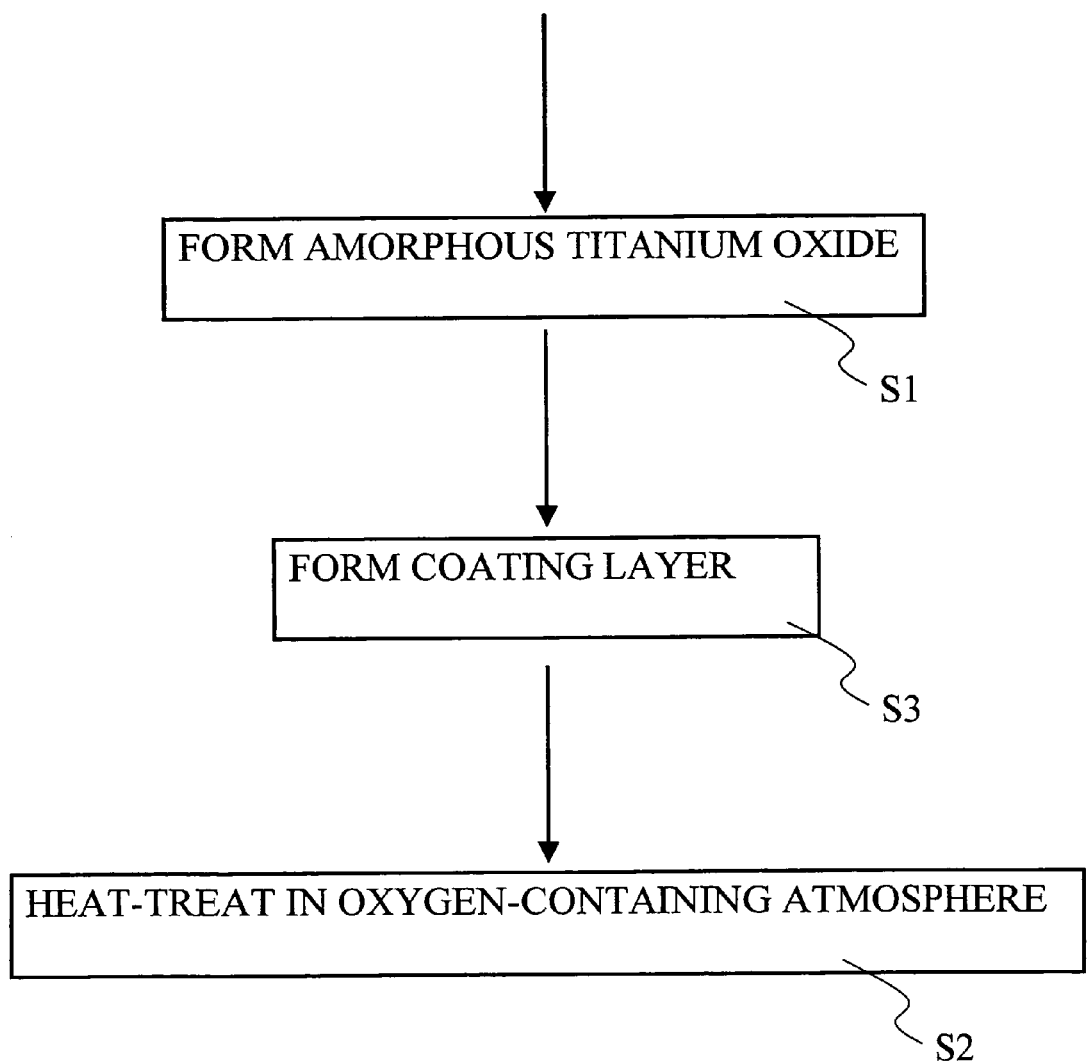
FIG. 18 is a flow chart showing a production method of a comparative example.

FIG. 18 is a flow chart showing a production method of a comparative example in such a sequence.

However, investigations by the inventors revealed that the photocatalytic property is lowered if the coating layer 30 is deposited (step S2) and then heat-treated (step S3) as shown in FIG. 18.

Figure 19:
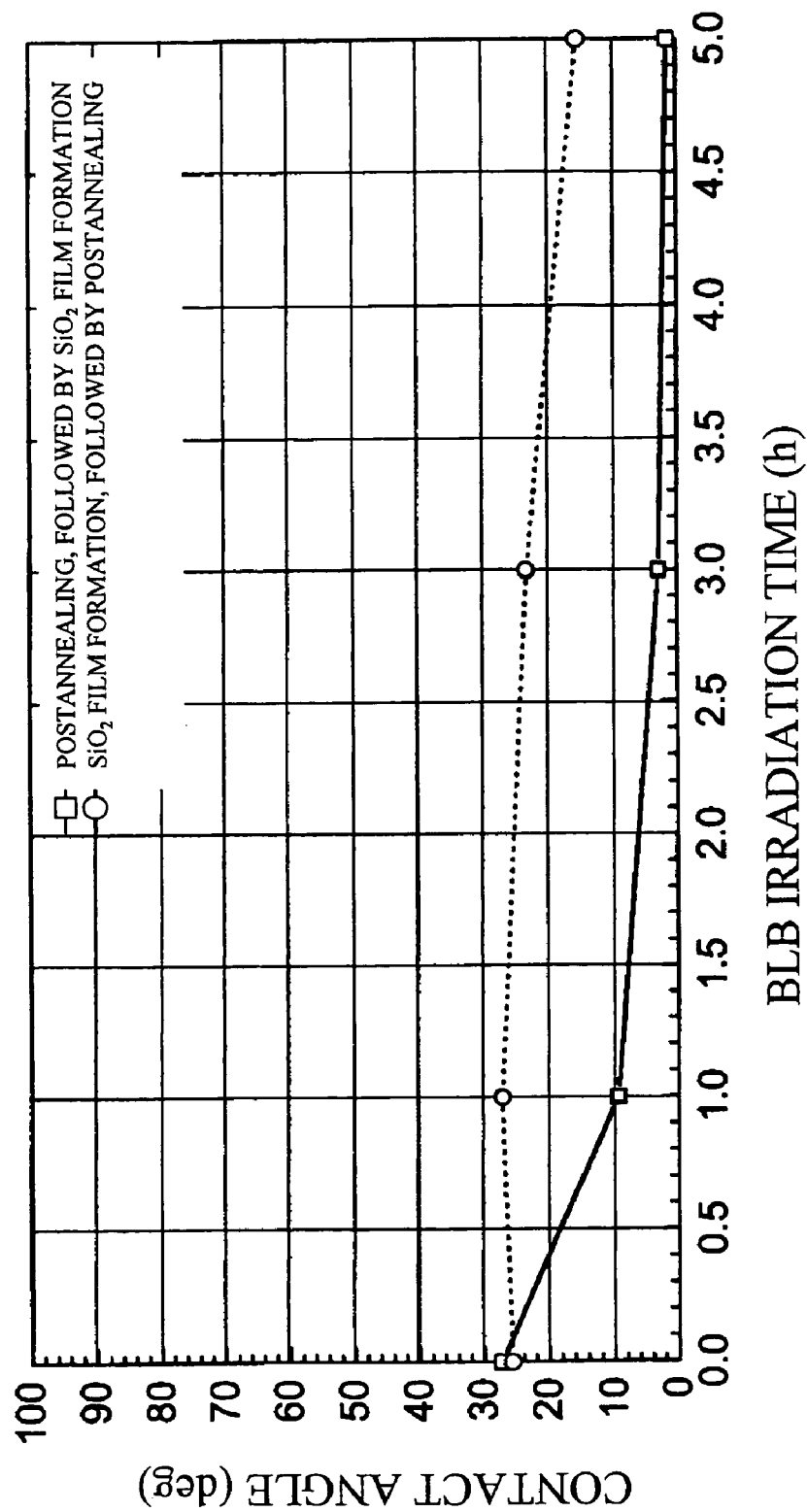
FIG. 19 is a graphical diagram showing a result of evaluating the photocatalytic property of a photocatalyst produced by the production method of the second embodiment of the invention and a photocatalyst produced by the production method of the comparative example shown in FIG. 18.

FIG. 19 is a graphical diagram showing a result of evaluating the photocatalytic property of a photocatalyst produced by the production method of the present embodiment and a photocatalyst produced by the production method of the comparative example shown in FIG. 18. More specifically, the figure shows a result of the wax decomposition hydrophilization test. The horizontal and vertical axes represent the irradiation time of black light and the contact angle of a water droplet at the surface, respectively.

In the photocatalyst produced in this case, a soda-lime glass, a silicon oxide film having a thickness of 20 nm, a titanium oxide film having a thickness of 50 nm, and a silicon oxide film having a thickness of 7 nm are used for the substrate 100, buffer layer 20, photocatalytic film 30, and coating layer 30, respectively.

In this case, titanium oxide is deposited by a reactive sputtering method using mixed gas of argon (Ar) and oxygen ($O_2$). The film formation condition is such that the input electric power is 2 kW, the total pressure is 3.5 Pa, and the oxygen addition ratio is 10%.

The coating layer 30 is also deposited by a reactive sputtering method using mixed gas of argon (Ar) and oxygen ($O_2$). The film formation condition is such that the input electric power is 300 W, the total pressure is 3.5 Pa, and the oxygen addition ratio is 30%.

The condition for heat treatment (step S2) in each case is 600° C. and one hour in the normal atmosphere.

The irradiation intensity of black light in the wax decomposition hydrophilization test is 500 $\mu W/cm^2$.

As can be seen from FIG. 19, the photocatalyst in accordance with the invention has an initial contact angle as low as about 27 degrees, and the contact angle rapidly decreases with irradiation of black light, so that an excellent catalytic property similar to that illustrated in FIG. 9 is obtained.

In contrast, the photocatalyst in accordance with the comparative example has a good initial value of contact angle of about 26 degrees, but the contact angle gradually decreases with irradiation of light, which reveals a decreased photocatalytic property. Presumably, this is because, if deposition of silicon oxide for the coating layer 30 is followed by heat treatment, the film quality of the coating layer 30 is changed and interferes with the photocatalysis of the photocatalytic film 10.

More specifically, it is likely that the film quality of the coating layer 30 is changed by heat treatment and interferes with the photocatalysis of the photocatalytic film 10.

In accordance with the production method of the invention, as shown in FIG. 17, the decrease of photocatalysis of the photocatalytic film 10 can be avoided by depositing the coating layer 30 after applying heat treatment.

Figure 20:
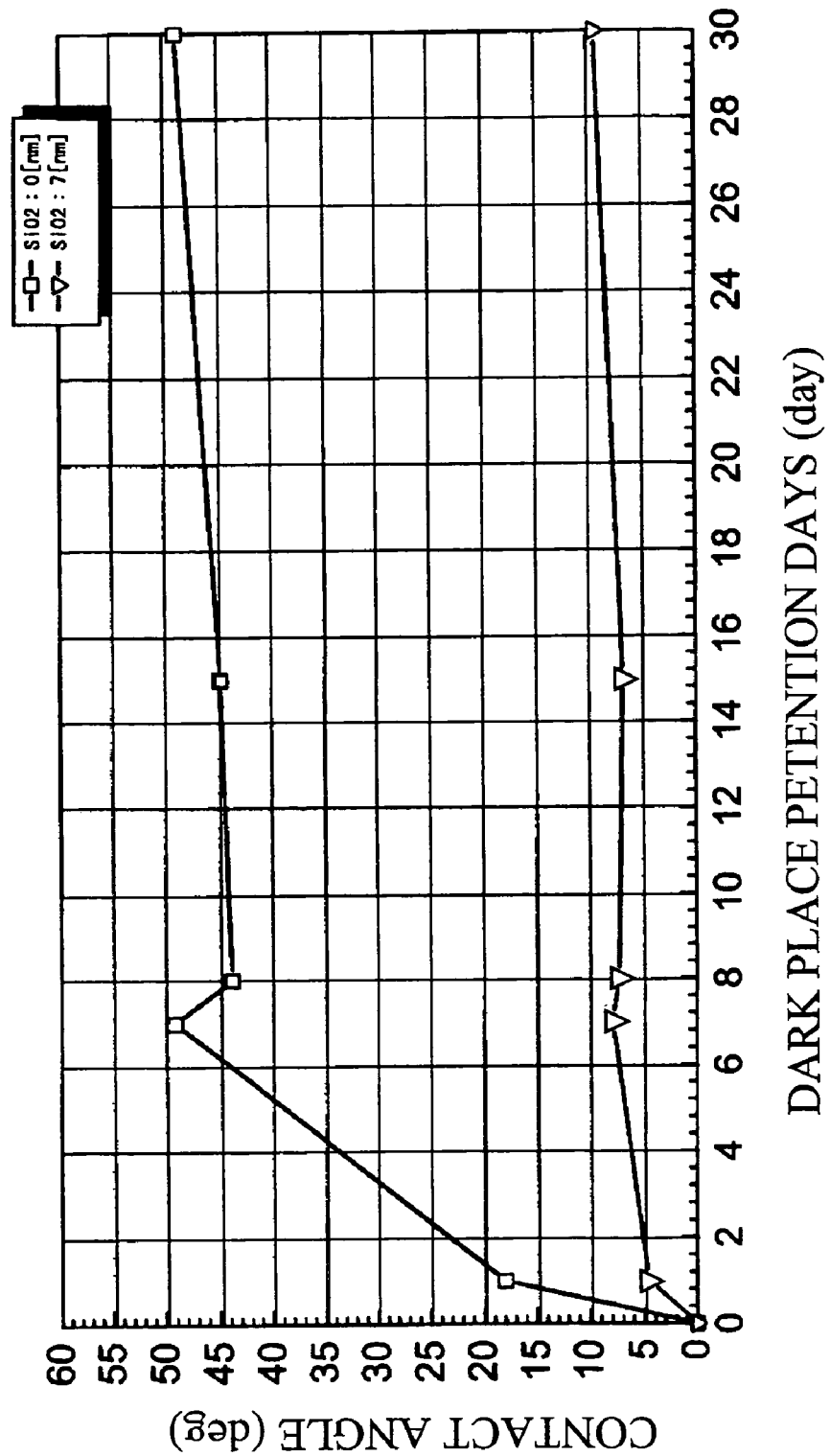
FIG. 20 is a graphical diagram illustrating a dark place retention property of a photocatalyst having a coating layer 30 provided thereon.

FIG. 20 is a graphical diagram illustrating a dark place retention property of a photocatalyst having a coating layer 30 provided thereon. More specifically, the figure shows a result of a wax decomposition hydrophilization test as shown in FIG. 19 where after black light is irradiated for 24 hours, the irradiation of black light is turned off to provide a dark place condition, and the subsequent variation of the contact angle of a water droplet is sequentially measured.

As can be seen from FIG. 20, in the photocatalyst without the coating layer 30 ($SiO_2$:0 nm), the contact angle sequentially increases after light irradiation is turned off, and increases up to about 45 degrees after eight days. In contrast, if the coating layer 30 is provided ($SiO_2$:7 nm), the increase of the contact angle after the turning off of light irradiation is smaller, which is about 7 degrees after eight days, and 10 degrees or less even after 30 days, maintaining an extremely good hydrophilicity.

As described above, in accordance with the invention, an extremely good dark place retention effect is obtained by depositing a coating layer 30 after applying heat treatment as shown in FIG. 17 without interfering with the photocatalysis of the photocatalytic film 10. As a result, a photocatalyst can be realized which can maintain the hydrophilicity of its surface at a high level whether it is irradiated with light or light is weak or blocked.

The method of producing a photocatalyst has been described in the context of the first and second embodiment of the invention.

Next, a specific example of the production apparatus suitable for use in producing the photocatalyst in accordance with the invention will be described.

Figure 21:
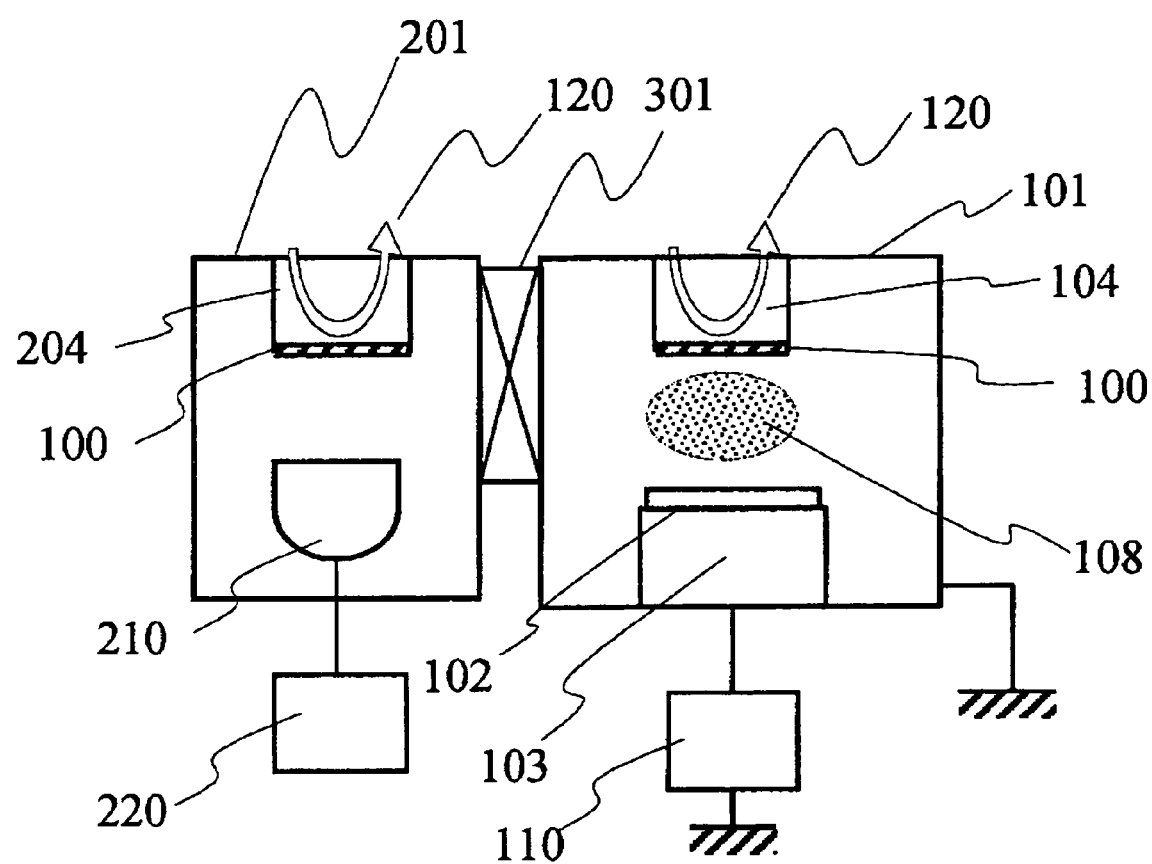
FIG. 21 is a conceptual diagram showing a specific example of a production apparatus in accordance with the invention.

FIG. 21 is a conceptual diagram showing a specific example of a production apparatus in accordance with the invention. In the figure, like elements as described above with reference to FIG. 4 are labeled with like reference numerals and will not be described further in detail. It is to be noted that in FIG. 21, the evacuation pump 106 and gas supply source 107 are omitted.

The apparatus of the present specific example has a structure comprising a chamber 101 for depositing a photocatalytic film of titanium oxide or the like, and an auxiliary chamber 201 for heating and degassing treatment, connected together via a gate valve 301. In the auxiliary chamber 201, a stage 204 for holding a substrate 100 is provided, where a cooling mechanism 120 is provided. The substrate 100 is held on the stage 204 in advance to deposition of a photocatalytic film, and can be heated and degassed by a heating mechanism 210 such as a lamp or heater.

Subsequently, the gate valve 301 is opened, and the substrate 100 is moved onto an anode 104 of the chamber 101 by means of a transportation mechanism, not shown, to deposit a photocatalytic film.

In this apparatus, the stage 204 is provided with the cooling mechanism 102, and thereby the substrate 100 can be rapidly cooled after degassing treatment to start the deposition step. In other words, in accordance with the invention, it is required to deposit an amorphous metal oxide. To this end, it is important to keep the temperature of the substrate 100 at a low level during the deposition. Thus, in the apparatus of the present specific example, the stage 204 is provided with the cooling mechanism 120, and thereby the substrate 100 can be immediately cooled after degassing treatment to start deposition. Accordingly, the throughput of the film formation step can be increased.

In addition, the auxiliary chamber 201 can be filled with an atmosphere containing oxygen such as the normal atmosphere, and the substrate 100 and the amorphous metal oxide layer deposited thereon can be heated to carry out the heat treatment in the production method of the invention.

Figure 22:
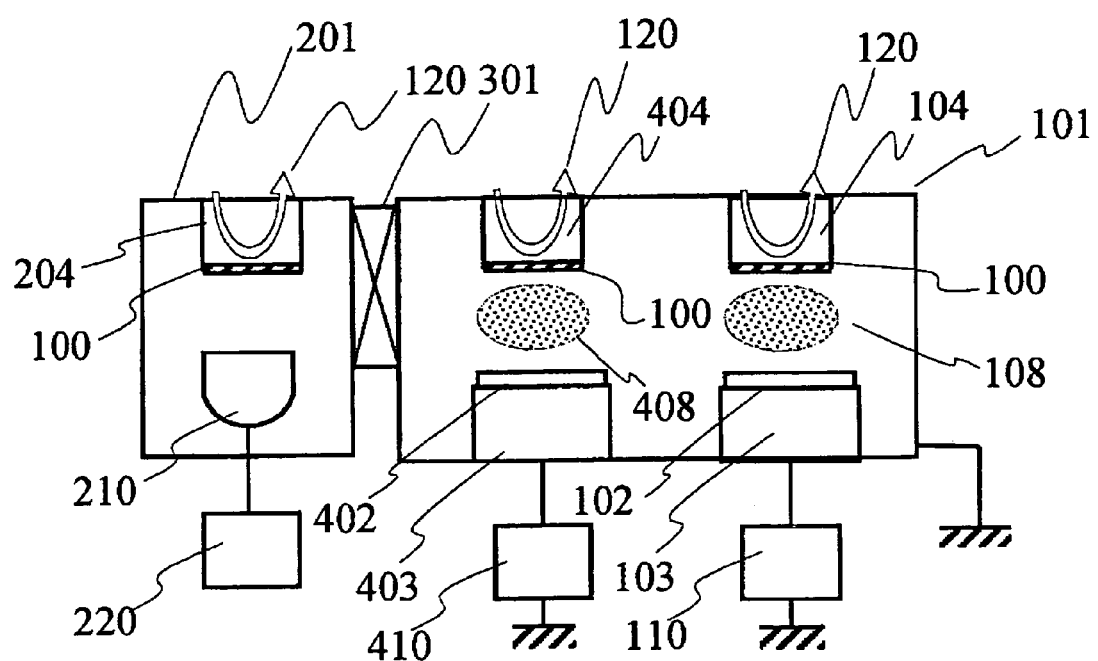
FIG. 22 is a conceptual diagram showing a second specific example of a production apparatus in accordance with the invention.

FIG. 22 is a conceptual diagram showing a second specific example of a production apparatus in accordance with the invention. Also in the figure, like elements as described above with reference to FIG. 4 or 21 are labeled with like reference numerals and will not be described further in detail. It is to be noted that also in FIG. 22, the evacuation pump 106 and gas supply source 107 are omitted.

In the apparatus of the present specific example, in addition to the target 102 for depositing a photocatalytic film of titanium or the like, the chamber 101 is provided with another target 402 of silicon oxide. More specifically, a plasma 408 is formed by applying a RF bias from a RF power supply 410 to a cathode 403 in an atmosphere containing oxygen. In this way, the silicon oxide target 402 can be sputtered to deposit silicon oxide on the substrate 100.

Figure 23:
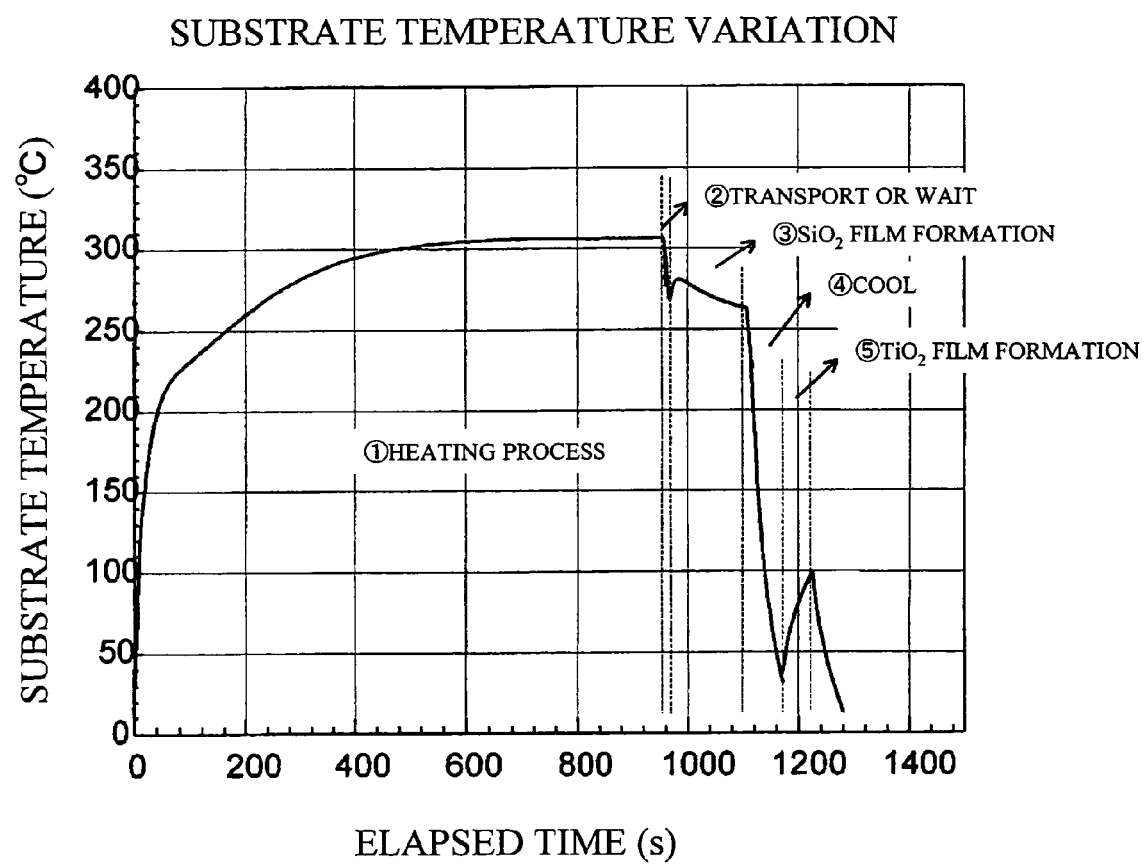
FIG. 23 is a graphical diagram showing an example of temperature history of the substrate 100 during a film formation process in which the production apparatus of the specific example of the invention is used.

FIG. 23 is a graphical diagram showing an example of temperature history of the substrate 100 during a film formation process in which the production apparatus of the present specific example is used. More specifically, in the figure, the horizontal axis represents the process elapsed time (second), and the vertical axis represents the temperature of the substrate (substrate 100).

In the specific example illustrated in FIG. 23, a series of steps are carried out comprising (1) heating process, (2) transportation time, (3) deposition of a buffer layer 20, (4) cooling, and (5) deposition of metal oxide.

First, in the (1) heating process, the substrate 100 is heated to a raised temperature by the heating mechanism 210 in the auxiliary chamber 201 in a vacuum. According to this process, gas molecules and moisture adsorbed on the surface of the substrate 100 are discharged and the surface is cleaned. In the specific example shown in FIG. 6, the substrate 100 is heated up to about 300° C. It is to be noted that the maximum heating temperature in this step can be appropriately determined in view of the material of the substrate 100, cleanliness of the surface, the throughput required for the film formation step, or the like.

Next, in the step of (2) transportation or waiting, the substrate 100 is transported into the chamber 101 by means of a transportation mechanism not shown. During this time, the temperature of the substrate 100 is decreased a little as shown.

Next, (3) $SiO_2$ or buffer layer 20 is deposited. The deposition of $SiO_2$ can also be carried out by the sputtering method. During this time, the temperature of the substrate 100 is increased to some extent by heat radiation from the sputtering source and the like, and then exhibits a tendency to be saturated.

Next, (4) cooling is carried out. More specifically, the substrate 100 can be rapidly cooled by operating the cooling mechanism 120 while the substrate 100 is held on the anode 404. However, this cooling is not necessarily carried out while the substrate 100 is held on the anode 404. The substrate 100 may be transported onto the anode 104 and cooled thereon.

When the substrate 100 is cooled to a predetermined temperature, (5) $TiO_2$ or metal oxide is deposited. During this time, as described above with reference to FIG. 5, the temperature of the substrate 100 is increased by heat radiation from the sputtering source and the like. However, since the substrate 100 has been cooled in advance to the deposition and the starting temperature has been sufficiently lowered, the deposition can be accomplished while maintaining the substrate at low temperatures. In the specific example shown in FIG. 23, the deposition starting temperature is 50° C. or less, and the maximum temperature at the end of the deposition of metal oxide is suppressed to about 100° C.

As described above, in accordance with the invention, the cooling mechanism 120 or equivalent cooling mechanism is provided. This facilitates applying heat treatment before depositing metal oxide. In addition, even if the buffer layer 20 is deposited, the substrate 100 can be rapidly cooled and maintained at sufficiently low temperatures during the deposition, and thereby an amorphous metal oxide can be obtained. In other words, even if degassing treatment or the like is carried out, the substrate can be rapidly cooled and immediately an amorphous thin film can be deposited thereon, thereby increasing the throughput of the film formation process.

It is to be noted that the film formation process shown in FIG. 23 is merely a specific example, and a variety of other procedures are possible as well. For example, after degassing/heating in the auxiliary chamber 201, the substrate 100 can be immediately cooled by the cooling mechanism 120 of the stage 204.

Next, a production apparatus suitable for carrying out the production method in accordance with the second embodiment of the invention will be described.

Figure 24:
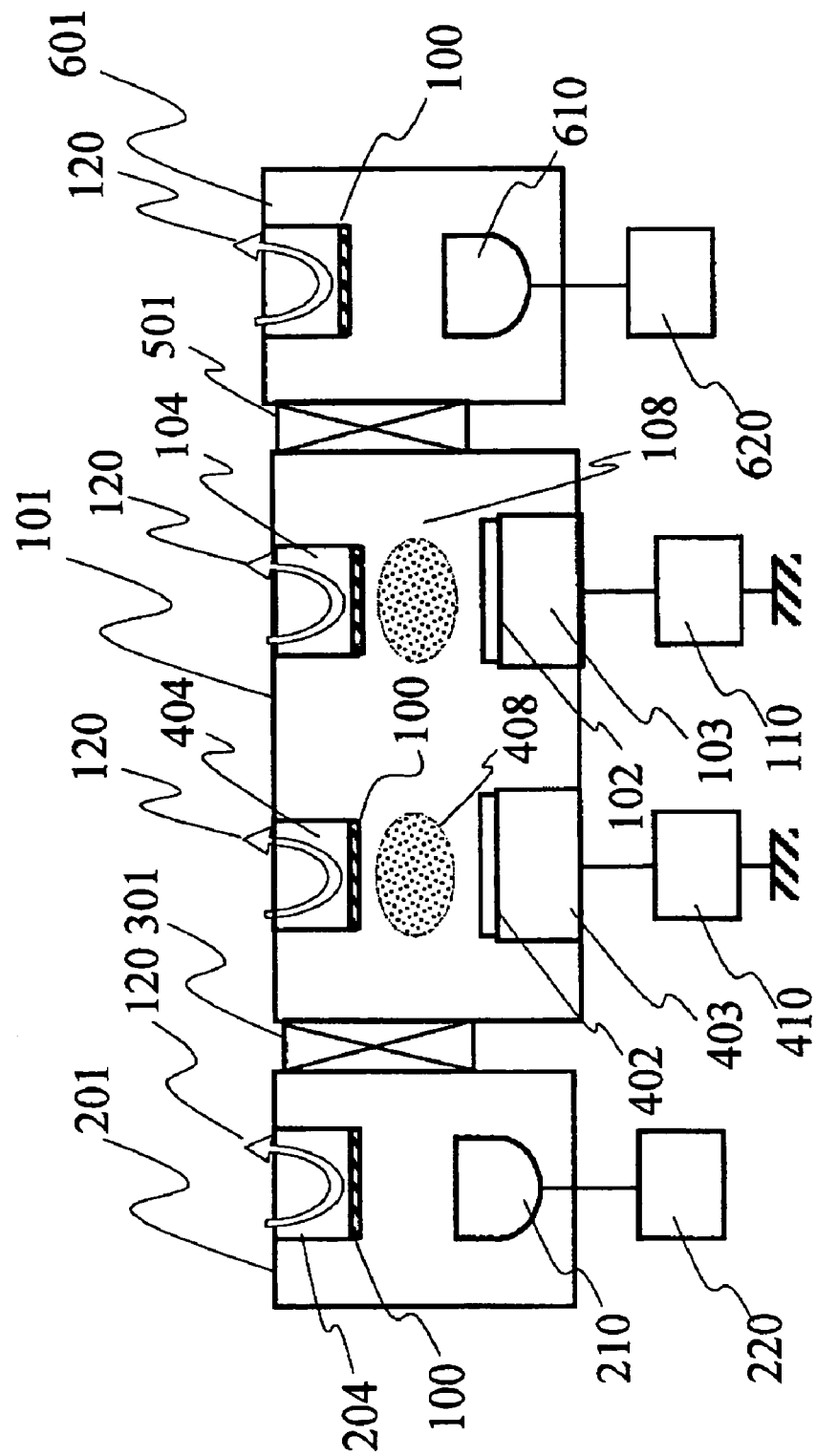
FIG. 24 is a conceptual diagram showing a third specific example of a production apparatus in accordance with the invention.

FIG. 24 is a conceptual diagram showing a third specific example of a production apparatus in accordance with the invention. Also in the figure, like elements as described above with reference to FIG. 4, 21 or 22 are labeled with like reference numerals and will not be described further in detail. It is to be noted that also in FIG. 24, the evacuation pump 106 and the gas supply source 107 are omitted.

The apparatus of the present specific example further comprises a heat treatment chamber 601 connected to the chamber 101. The heat treatment chamber 601 comprises a stage 604 and a heating mechanism 610. The chamber 601 can be filled with an atmosphere containing oxygen and heat treatment can be applied by the heating mechanism 610 while the substrate 100 is held on the stage 604.

An example procedure of producing a photocatalyst using this apparatus is described as follows.

First, a substrate 100 is introduced into the chamber 201 and subjected to degassing/heating treatment. To do this, as described above with reference to FIG. 21, it is desirable that the heating treatment is carried out in a vacuum.

Next, the substrate 100 is transported onto the stage 404, and silicon oxide, for example, is deposited thereon as a buffer layer 20. Subsequently, the substrate 100 is transported onto the stage 104, and an amorphous titanium oxide, for example, is deposited thereon as a photocatalytic film 10.

Next, the substrate 100 is transported onto the stage 604, and subjected to heat treatment in an atmosphere containing oxygen, thereby crystallizing at least a portion of metal oxide such as titanium oxide to obtain an active photocatalytic film containing crystal.

Next, the substrate is again transported onto the stage 404, and silicon oxide, for example, is deposited thereon as a coating layer 30.

As described above, in accordance with the present specific example, the heating/degassing chamber 201, deposition chamber 101, and heat treatment chamber 601 are each provided, and thereby each of these steps can be carried out continuously and concurrently. As a result, the production method in accordance with the invention can be carried out with great efficiency, and a high-performance photocatalyst can be produced at a high production efficiency.

In addition, the degassing/heating chamber 201 and the heat treatment chamber 601 are separately provided. As a result, the degassing/heating treatment in a vacuum and the heat treatment for crystallization in an atmosphere containing oxygen can be independently carried out, and moreover, the inside of the degassing/heating chamber 201 can avoid oxidation.

The embodiment of the invention have been described with reference to the specific examples. However, the invention is not limited to these specific examples.

For example, the photocatalytic film in accordance with the invention is not limited to titanium oxide ($TiO_x$). Similar effects can be obtained by using titanium oxide with predetermined additional elements or other photocatalytic metal oxides, which are also encompassed within the scope of the invention.

Further, the substrate 100 to which the photocatalyst of the invention may apply includes various materials such as a rearview mirror, body, and windowpane for an automobile; a variety of mirrors for a bath room and the like; an outer wall material for a building; an inner wall material for a bath room; a toilet stool; a sink; a signpost, and external materials of various displays.

Moreover, the method for use as a method of depositing a photocatalytic film in the production method of the invention is not limited to the DC sputtering method, but includes all methods that can obtain an amorphous metal oxide such as RF sputtering, vacuum evaporation and other methods.

INDUSTRIAL APPLICABILITY

As described above in detail, in accordance with the invention, a photocatalyst having a good photocatalysis can be obtained by forming an amorphous metal oxide and heat-treating it in an atmosphere containing oxygen.

Further, in accordance with the invention, a good photocatalysis can be obtained even in an extremely thin photocatalytic film having a film thickness of 25 nm. Therefore, the film formation time can be reduced and a high productivity can be achieved.

Moreover, in accordance with the invention, as described above, the film thickness of the photocatalytic film can be made smaller than the wavelength band of visible light by nearly one order of magnitude, so that "color mottling" can be eliminated. As a result, for example, a good field of vision can be ensured even in applications such as rearview mirrors for an automobile and vapor-proof mirrors and windowpanes for a bath room, achieving an extremely great advantage.

In the case of applications to a rearview mirror for an automobile, a clear field of vision and safety can be obtained according to droplet-resistant and defogging effects of the photocatalytic film. Also, in the case of applications to an automotive body, a signpost, and an outer wall material for a building, a self-cleaning effect by rainfall can be obtained.

On the other hand, in accordance with the invention, the sputtering apparatus is provided with means for cooling a substrate. As a result, metal oxide can be deposited while the substrate is maintained at sufficiently low temperatures, and thereby an amorphous metal oxide film required for carrying out the invention can be rapidly formed.

Consequently, in accordance with the invention, a high-performance photocatalyst can be provided at a low price. A variety of coated bodies using the photocatalyst can be supplied in markets, thus contributing much to industrial fields.

The invention claimed is:

1. A method of producing a photocatalyst comprising in order:
   forming an amorphous titanium oxide on a substrate by a reactive sputtering method using a target comprising titanium and an oxygen gas;
   crystallizing at least a portion of the titanium oxide by heating the titanium oxide in an atmosphere comprising oxygen; and
   forming a coating layer of oxide on the titanium oxide.

2. The method of producing a photocatalyst according to claim 1, wherein
   the amorphous titanium oxide does not substantially have crystalline peaks in an X-ray diffraction pattern; and
   the crystallized titanium oxide has crystalline peaks in an X-ray diffraction pattern.

3. The method of producing a photocatalyst according to claim 1 or 2, wherein the amorphous titanium oxide has a composition formula $TiO_x$ with its oxygen composition x being substantially equal to 2.

4. The method of producing a photocatalyst according to claim 1, wherein the formation of the amorphous titanium oxide is carried out at a total pressure of the atmosphere during deposition in the reactive sputtering method and at an addition ratio of oxygen contained in the atmosphere such that when a graph with xy-coordinates is plotted, wherein the x-axis represents said pressure in pascal (Pa) and the y-axis represents said addition ratio in percent (%), respectively, and the points with xy-coordinates of (1.0, 30), (3.5, 10), (5.0, 13), (5.0, 30), (3.5, 30), (1.0, 50), and (1.0, 30) in this order, are connected, thereby forming a polygon, the total pressure and the addition ratio are defined by the region within and including the boundaries of the polygon.

5. The method of producing a photocatalyst according to claim 1, wherein the partial pressure of the oxygen gas during deposition in the reactive sputtering method is greater than 0.1 pascal and less than 1.7 pascal.

6. The method of producing a photocatalyst according to claim 1, wherein the heating temperature of the crystallization is 300° C. or higher.

7. The method of producing a photocatalyst according to claim 1, wherein the coating layer comprises silicon oxide.

8. The method of producing a photocatalyst according to claim 1, wherein the formation of the coating layer is carried out by a reactive sputtering method using a target comprising an element or elements contained in the coating layer and oxygen gas.

9. The method of producing a photocatalyst according to claim 1, further comprising cooling the substrate before forming the amorphous titanium oxide on the substrate.

10. The method of producing a photocatalyst according to claim 9, further comprising heating the substrate before cooling the substrate.

11. The method of producing a photocatalyst according to claim 10, wherein the heating the substrate includes forming a buffer layer on the substrate.

12. The method of producing a photocatalyst according to claim 11, wherein the buffer layer is made of silicon oxide.

* * * * *